United States Patent
Tokui et al.

(10) Patent No.: US 6,985,397 B2
(45) Date of Patent: Jan. 10, 2006

(54) SEMICONDUCTOR STORAGE DEVICE AND PORTABLE ELECTRONIC EQUIPMENT HAVING THE SAME

(75) Inventors: Kei Tokui, Chiba (JP); Hiroshi Iwata, Ikoma-gun (JP); Yoshifumi Yaoi, Yamatokooriyama (JP); Akihide Shibata, Nara (JP); Masaru Nawaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/808,581

(22) Filed: Mar. 25, 2004

(65) Prior Publication Data

US 2004/0190361 A1 Sep. 30, 2004

(30) Foreign Application Priority Data

Mar. 26, 2003 (JP) ................................. P2003-085087
May 20, 2003 (JP) ................................. P2003-142318

(51) Int. Cl.
*G11C 7/00* (2006.01)
*G11C 16/04* (2006.01)

(52) U.S. Cl. .............. 365/226; 365/185.19; 365/185.18
(58) Field of Classification Search ................. 365/226, 365/185.19, 185.18, 189.09
See application file for complete search history.

(56) References Cited

U.S. PATENT DOCUMENTS 5,602,794 A * 2/1997 Javanifard et al. .......... 365/226
5,781,473 A * 7/1998 Javanifard et al. ..... 365/185.18
6,101,125 A * 8/2000 Gorman ................. 365/185.19
2004/0108512 A1 6/2004 Iwata et al.
2004/0160828 A1 8/2004 Iwata et al.
2004/0164359 A1 8/2004 Iwata et al.

FOREIGN PATENT DOCUMENTS

| JP | 63-237580 A | 10/1988 |
| JP | 5-304277 A | 11/1993 |
| JP | 09-097849 A | 4/1997 |
| JP | 9-116119 A | 5/1997 |
| JP | 2001-156188 A | 6/2001 |
| JP | 2001-230332 A | 8/2001 |
| WO | WO 97/12369 A1 | 4/1997 |
| WO | WO 99/07000 A2 | 2/1999 |
| WO | WO-02/067320 A1 | 8/2002 |

* cited by examiner

*Primary Examiner*—Anh Phung
(74) *Attorney, Agent, or Firm*—Birch, Stewart, Kolasch & Birch, LLP

(57) ABSTRACT

A semiconductor storage device has a variable-stage charge pump, and a memory cell array to which an output from an output line of the variable-stage charge pump is fed. In the variable-stage charge pump, first and second charge pumps are connected in parallel between a common input bus and a common output bus. A first n-channel MOSFET is provided on a line connecting an output terminal of the first charge pump and the common output bus, and another n-channel MOSFET is provided on a line connecting the second charge pump and the common output bus. First switches are provided between the output terminal of the first charge pump and the first n-channel MOSFET, and between the input terminal of the second charge pump and the second switch. A second switch is provided on a line connecting an input terminal of the second charge pump and the common input bus.

9 Claims, 16 Drawing Sheets

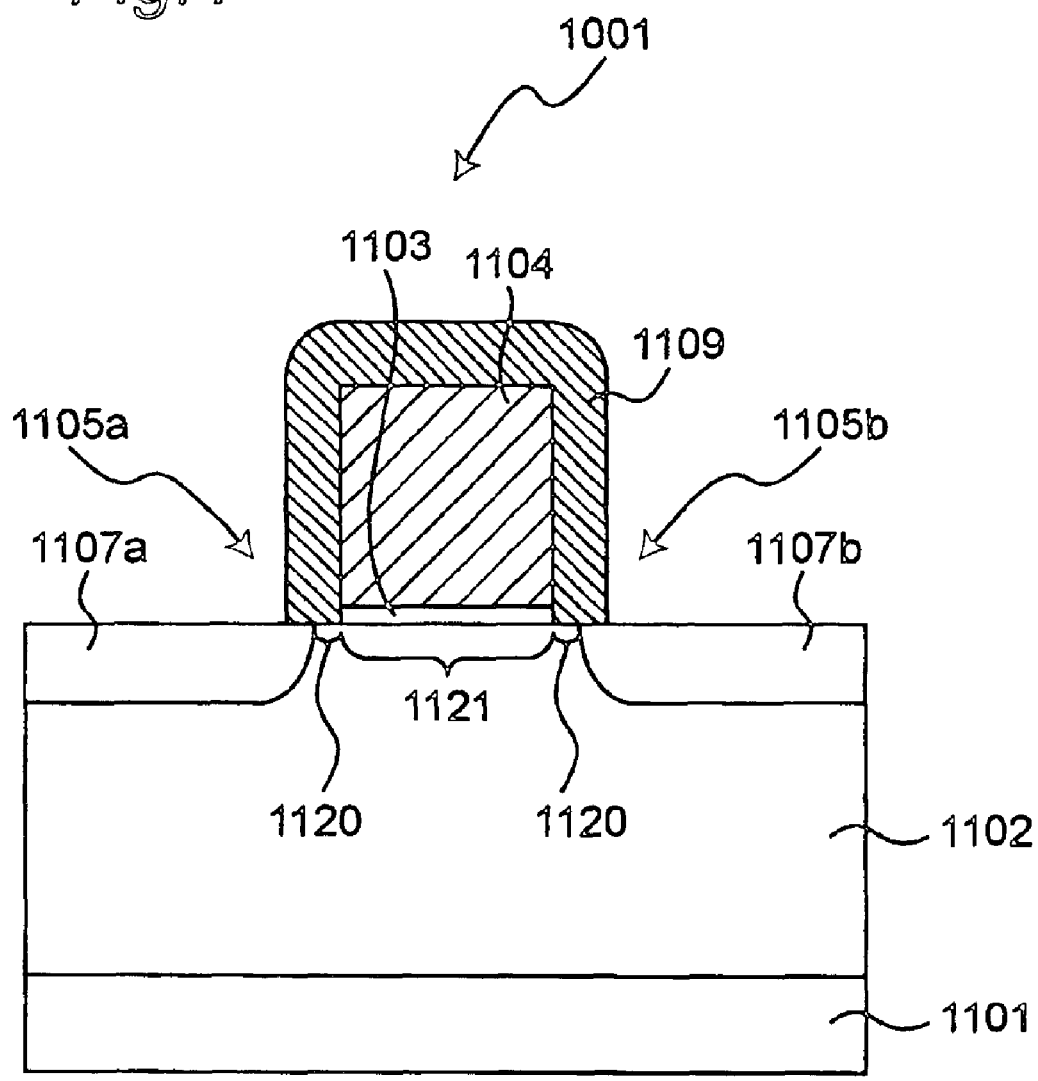

| SW 130 | SW 131 | CHARGE PUMP 110 | CHARGE PUMP 120 |
|---|---|---|---|
| OFF | OFF | ON | OFF |
| OFF | ON | ON | CONNECTED IN PARALLEL TO CHARGE PUMP 110 |
| ON | OFF | ON | CONNECTED IN SERIES WITH CHARGE PUMP 110 |
| ON | ON | N/A | N/A |

SEMICONDUCTOR STORAGE DEVICE AND PORTABLE ELECTRONIC EQUIPMENT HAVING THE SAME

This nonprovisional application claims priority under 35 U.S.C. §119(a) on Patent Applications Nos. 2003-85087 and 2003-142318 filed in Japan on Mar. 26, 2003 and May 20, 2003, respectively, the entire contents of which are hereby incorporated by reference.

BACKGROUND OF THE INVENTION

The present invention relates to a semiconductor storage device and portable electronic equipment that employs the semiconductor storage device.

Conventionally, a flash memory has typically been used as a nonvolatile semiconductor storage device.

In this flash memory, as shown in FIG. 26, a floating gate 902, an insulation film 907 and a word line (control gate) 903 are formed in this order via a gate insulation film 908 on a semiconductor substrate 901, and a source line 904 and a bit line 905 are formed on both sides of the floating gate 902, constituting a memory cell. Around this memory cell are formed element isolation regions 906 (refer to JP 5-304277 A).

The memory cell retains storage as the quantity of charge in the floating gate 902. In the memory cell array constructed by arranging the memory cells, the desired memory cell can be subjected to rewrite and read operations by selecting the specified word line and bit line and applying a prescribed voltage to the lines.

The flash memory as described above exhibits a drain current Id to gate voltage Vg characteristic indicated by the solid line curve and the dashed line curve in FIG. 27 when the quantity of charges in the floating gate 902 changes. That is, if the quantity of negative charges in the floating gate 902 is increased, then the characteristic curve changes from the characteristic indicated by the solid line curve to the characteristic indicated by the broken line curve in FIG. 27, and the Id-Vg curve is displaced roughly parallel in a direction in which the gate voltage Vg increases with respect to same drain current Id, and the threshold voltage increases.

However, the flash memory as described above has been functionally required to arrange the insulation film 907 that isolates the floating gate 902 from the word line 903 and had difficulties in reducing the thickness of the gate insulation film to prevent the leak of charges from the floating gate 902. Therefore, it has been difficult to effectively reduce the thickness of the insulation film 907 and the gate insulation film, and this has hindered the miniaturization of the memory cell.

Also, in a semiconductor storage device in which the above memory cells are used for a memory cell array, obtaining a plurality of different voltage levels in a charge pump device would involve providing exclusive charge pump circuits for the individual voltage levels, respectively. This poses a problem that the number of charge pump circuits would be increased, incurring an increase of the circuit area.

SUMMARY OF THE INVENTION

Accordingly, an object of the present invention is to provide a semiconductor storage device capable of obtaining a plurality of different voltage levels even if the circuit area is decreased.

Another object of the present invention is to provide high-function, small-size and low-cost portable electronic equipment by using the semiconductor storage device.

In order to accomplish the above object, a semiconductor storage device according to the present invention includes:

a charge pump device; and a memory cell array to which an output from an output line of the charge pump device is fed and which uses nonvolatile memory elements as memory cells, wherein the charge pump device has:

k (where k is a positive integer equal to or more than 2) charge pumps which are connected between an input line and the output line;

output-side switch means for electrically connecting or disconnecting respective output terminals of the k charge pumps to or from the output line;

input-side switch means for electrically connecting or disconnecting input respective terminals of the charge pumps except one charge pump, respectively, to or from the input line; and series-connection switch means for electrically connecting or disconnecting the output terminal of an nth (where n is an integer of 1 to k−1) charge pump to or from the input terminal of an (n+1)th charge pump, and wherein the nonvolatile memory elements each have:

a gate electrode formed on a semiconductor layer with a gate insulator disposed therebetween;

a channel region placed under the gate electrode with the gate insulator disposed therebetween;

diffusion regions placed on opposite sides of the channel region, respectively, and having a conductive type opposite to that of the channel region; and memory-function bodies formed on opposite sides of the gate electrode, respectively, and having a function of holding electric charges.

In the charge pump device of the semiconductor storage device with the above construction, when the series-connection switch means electrically connects the output terminal of an nth (second, for example) charge pump to the input terminal of an (n+1)th (third, for example) charge pump, and the input-side switch means electrically connects the input terminal of the nth charge pump to the input line while electrically disconnecting the input terminal of the (n+1)th charge pump from the input line, and the output-side switch means electrically disconnects the output terminal of the nth charge pump from the output line while electrically connecting the output terminal of the (n+1)th charge pump to the output line, then the nth charge pump and (n+1)th charge pump become connected in series with each other.

On the other hand, when the series-connection switch means electrically disconnects the output terminal of an nth (second, for example) charge pump from the input terminal of an (n+1)th (third, for example) charge pump, and the input-side switch means electrically connects the input terminals of the nth and (n+1)th charge pumps to the input line, and the output-side switch means electrically connects the output terminals of the nth and (n+1)th charge pumps to the output line, then the nth charge pump and (n+1)th charge pump become connected in parallel to each other.

In this way, the charge pump device allows the nth and (n+1)th charge pumps to be connected in series or in parallel, so that a number of voltage levels are obtainable without using charge pumps exclusive to the respective voltage levels, with the result that the number of circuits required is reduced.

In one embodiment, the output-side switch means includes output-side switches provided on lines, respectively, that connect the individual output terminals of the charge pumps to the output line. The input-side switch means includes input-side switches provided on lines, respectively, that connect the individual input terminals of the charge pumps except the one charge pump to the input line. Also, the series-connection switch means includes a series-connection switch provided on a line that connects the output terminal of the nth charge pump to the input terminal of the (n+1)th charge pump.

In the charge pump device of the semiconductor storage device with this constitution, if the nth (e.g., first) series-connection switch is ON and the input-side switch connected to the input terminal of the (n+1)th (e.g., second) charge pump is OFF, then the nth output-side switch is turned OFF and the (n+1)th output-side switch is turned ON. As a result, the nth charge pump and the (n+1)th charge pump are connected in series to each other.

Also, in this charge pump device, if the nth series-connection switch is OFF and the input-side switch connected to the input terminal of the (n+1)th charge pump is ON, then the nth output-side switch is turned ON and the (n+1)th output-side switch is turned ON. As a result, the nth charge pump and the (n+1)th charge pump are connected in parallel to each other.

Thus, since it is possible in this charge pump device to make the nth charge pump and the (n+1)th charge pump connected in series to each other and make the nth charge pump and the (n+1)th charge pump connected in parallel to each other, a plurality of voltage levels can be obtained without using charge pumps exclusive for the individual voltage levels, so that the number of circuits can be reduced.

Each of the above nonvolatile memories, by virtue of having memory function bodies on both sides of the gate electrode, allows scaling for the gate insulator to be implemented, thus strong to the short-channel effect. As a result, the memory cells, even if more micro-fined, are capable of storage of two bits or more. Thus, the circuit area of the memory cell array can be reduced, so that the storage device can be downsized.

Further, because the circuit area of the charge pump device can also be reduced, the circuit-area reduction effect brought by the micro-fabrication of the nonvolatile memory elements and/or the multi-value storage is not impaired. Thus, the storage device can be made even smaller.

The formation process for the nonvolatile memory elements is highly compatible with the formation process for ordinary transistors. Therefore, it becomes implementable to reduce the number of masks and the number of process steps by leaps, as compared with cases where flash memories are used as the nonvolatile memory elements and mounted compositely with peripheral circuits composed of ordinary transistors. Consequently, the chip yield is improved and the cost reduction can be achieved.

In one embodiment, k is 2. That is, the semiconductor storage device has first and second charge pumps, first and second output-side switches, one input-side switch, and one series-connection switch.

In one embodiment, each output-side switch consists of a diode-connected field-effect transistor. The term "diode-connected" or "diode-connection" refers to a state that a gate of the transistor is connected to one of a source or a drain of the transistor.

According to the above arrangement, in connecting the nth charge pump and the (n+1)th charge pump in series to each other, it is possible to prevent the nth output-side switch being turned on so that the input and output terminals of the (n+1)th charge pump are prevented from being short-circuited when the (n+1)th output-side switch is turned on.

As is understood from the above, the output-side switches can be controlled by using a current flowing between the input line and the output line. Therefore, the need for providing, for example, a control circuit for controlling the output-side switches is eliminated, so that the circuit area can be further reduced.

In one embodiment, at least one of the k charge pumps includes a plurality of pump stages connected in series. Every one of the k charge pumps may include a plurality of pump stages connected in series to one another.

In this case, desired voltage levels can be obtained securely by properly setting the number of pump stages.

Further, properly setting the number of pump stages eliminates the need for using, for example, any voltage divider or shunt, thus making the power consumption reduction achievable.

In one embodiment, the semiconductor storage device further includes at least one voltage polarity inversion circuit provided on a line that connects an output terminal of the semiconductor storage device and an input terminal of the memory cell array.

In this case, a negative voltage required for each operation mode of the nonvolatile memory elements can be obtained. Therefore, the need for providing a negative-voltage charge pump only for supplying negative voltages to the nonvolatile memory elements is eliminated, and the negative voltage can be supplied to the memory cell array with a small circuit area.

In one embodiment, at least part of the memory function bodies owned by the memory element overlaps with part of the diffusion regions.

In one embodiment, the memory function bodies of each nonvolatile memory element each include a film having a surface roughly parallel to a surface of the gate insulation film and having a function of retaining electric charges, and an insulation film separating the film having the function of retaining electric charges from the channel region or the semiconductor layer. The insulation film has a film thickness thinner than a film thickness of the gate insulation film and not smaller than 0.8 nm.

In the above two embodiments, by reducing the voltages for the write (program) and erase operations of the nonvolatile memory elements, the film thickness of the gate insulation film is not required to be thick in order to cope with a high voltage dissimilarly to prior art. Therefore, the short-channel effect of the transistors that constitute the memory elements and a circuit to operate the memory elements is reduced. Consequently, the transistors that constitute the memory elements and the circuit to operate the memory elements are allowed to have a channel length shorter than in prior art.

Moreover, the area of elements such as capacitors included in the charge pump device can be reduced.

Therefore, the circuit area of the semiconductor storage device can be largely reduced.

A portable electronic equipment of the present invention has the above-mentioned semiconductor storage device.

The portable electronic equipment having the above-mentioned construction has the semiconductor storage device that can retain the storage of two bits or more per transistor and is easy to miniaturize. Therefore, the portable electronic equipment can have high functions and its downsizing is achievable, which in turn enables reduction of the manufacturing cost.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 1 is a schematic sectional view of an essential part of a memory element in a semiconductor storage device of a first embodiment of the present invention;

DETAILED DESCRIPTION OF THE PREFERRED EMBODIMENTS

Figure 2A:
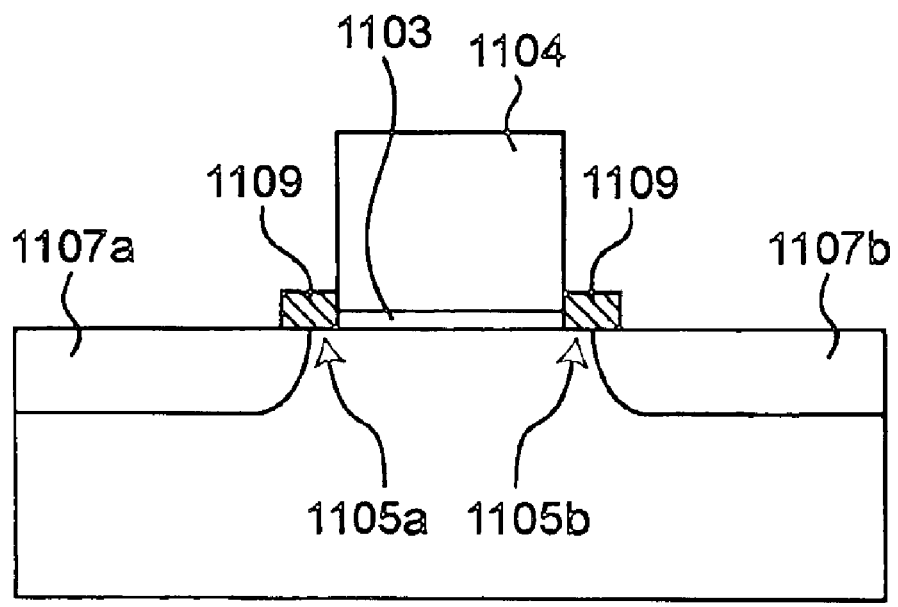
FIGS. 2A and 2B are schematic sectional views of essential parts of modifications of the memory element in the semiconductor storage device of the first embodiment.

An outline of a nonvolatile memory element to be employed in the semiconductor storage device of the present invention will be described first.

The memory element is constructed mainly of a semiconductor layer, a gate insulation film, a gate electrode, a channel region, a diffusion region and a memory function body. In this case, the channel region generally means a region of the same conductive type as that of the semiconductor layer, or a region right under the gate electrode, while the diffusion region means a region of the conductive type opposite to that of the channel region.

In concrete, the memory element of the present invention, which may be constructed of one first conductive type region that is the diffusion region, a second conductive type region that is the channel region, one memory function body arranged across regions of the first and second conductive types, and an electrode provided via the gate insulation film, should properly be constructed of a gate electrode formed on the gate insulation film, two memory function bodies formed on both sides of the gate electrode, two diffusion regions arranged on both sides of the memory function body oppositely to the gate electrode, and a channel region arranged under the gate electrode.

The semiconductor device of the present invention should be formed as a semiconductor layer on a semiconductor substrate or preferably formed on a well region of the first conductive type formed in the semiconductor substrate.

The semiconductor substrate is not specifically limited so long as it is used for a semiconductor device, and there can be enumerated, for example, bulk substrates of elemental semiconductors of silicon, germanium and so on and compound semiconductors of silicon germanium, GaAs, InGaAs, ZnSe, GaN and so on. Moreover, it is acceptable to employ various substrates such as an SOI (Silicon on Insulator) substrate, an SOS (Silicon on Sapphire) substrate and a multi-layer SOI substrate and a glass or plastic substrate on which a semiconductor layer is possessed, as those which have a semiconductor layer on its surface. Among others, a silicon substrate, an SOI substrate on the surface of which a silicon layer is formed or the like, is preferable. The semiconductor substrate or the semiconductor layer may be of a single crystal (by, for example, epitaxial growth), polycrystal or amorphous although there are variations in the quantity of current flowing inside.

In the semiconductor layer, it is preferable that device isolation regions are formed. Elements such as transistors, capacitors and resistors, circuits composed of such elements, semiconductor devices, and an inter-layer insulating film or films may be formed in combination in a single or a multilayer structure on the semiconductor substrate or the semiconductor layer. It is noted that the device isolation regions may be formed by any of various device isolation films including a LOCOS (local oxidation of silicon) film, a trench oxide film, and an STI (Shallow Trench Isolation) film. The semiconductor layer may be either of a P type or an N type conductivity type, and it is preferable that at least one first conductivity type (P type or N type) well region is formed in the semiconductor substrate. Acceptable impurity concentrations of the semiconductor layer and the well region are those within the range known in the art. It is noted that in the case of using an SOI substrate as the semiconductor layer, a well region may be formed in the surface semiconductor layer, and also a body region may be provided under the channel region.

Materials of the gate insulating film are not particularly limited as far as they are usable in typical semiconductor apparatuses. For example, insulating films including a silicon oxide film and a silicon nitride film, and high-dielectric films including aluminum oxide films, titanium oxide films, tantalum oxide films, hafnium oxide films are usable in the form of a single-layer film or a multi-layer film. Among others, the silicon oxide film is preferable. An appropriate thickness of the gate insulating film is, for example, approx. 1 to 20 nm, preferably 1 to 6 nm. The gate insulating film may be only formed right under the gate electrode, or may be formed to be larger (in width) than the gate electrode.

The gate electrode is formed on the gate insulation film normally in a shape for use in a semiconductor device or a shape that has a concave portion in a lower end portion. The gate electrode, which should preferably be formed in an integrated body without being separated by a single layer or multi-layer conductive film, may be arranged in a separated state by the single layer or multi-layer conductive film. Moreover, the gate electrode may have a side wall insulation film on the side wall. The gate electrode is normally not specifically limited so long as it is used for a semiconductor device, and there can be enumerated the conductive films of: for example, polysilicon; metals of copper and aluminum; high-melting-point metals of tungsten, titanium and tantalum; a single layer film or a multilayer film of high-melting-point metal and silicide thereof; and so on. The gate electrode should properly be formed with a film thickness of, for example, about 50 to 400 nm. It is to be noted that a channel region is formed under the gate electrode.

It is preferred that the gate electrode is formed only on a side surface of the memory function body described later or does not cover the upper portion of the memory function body. With this arrangement, a contact plug can be arranged closer to the gate electrode, and therefore, the miniaturization of the memory element is facilitated. Moreover, the memory element, which has a simple arrangement as described above, is easy to manufacture, and the yield can be improved.

The memory function body has at least a function to retain electric charges (hereinafter referred to as a "charge retention function"). In other words, the memory function body has a function to store and retain charges, trap charges or retain a charge polarized state. This function is fulfilled by the memory function body that includes, for example, a film or region having the charge retention function. As a material that fulfills this function, there can be enumerated: silicon nitride; silicon; silicate glass containing impurities of phosphorus, boron or the like; silicon carbide; alumina; high dielectric materials of hafnium oxide, zirconium oxide, tantalum oxide and the like; zinc oxide; ferroelectric substance; metal and so on. Therefore, the memory function body can be formed of a single layer or laminate structure of: an insulation film including a silicon nitride film; an insulation film including a conductive film or a semiconductor layer inside; an insulation film including at least one conductor or semiconductor dot; or an insulation film including a ferroelectric film in which internal charges are polarized by an electric field and the state is retained. Among others, the silicon nitride film, in which a number of levels for trapping charges exist, is therefore able to obtain a great hysteresis characteristic. Moreover, a charge retention time is long, and there occurs no problem of charge leak due to the generation of a leak path, and therefore, a retention characteristic is satisfactory. Furthermore, a silicon nitride film is preferable because it is normally used in the LSI process.

Use of an insulating film containing inside an insulating film having a charge retention function such as a silicon nitride film enables increase of reliability relating to memory holding. Since the silicon nitride film is an insulator, electric charges of the entire silicon nitride film will not be immediately lost even if part of the electric charges are leaked. Further, in the case of arraying a plurality of memory elements, even if the distance between the memory elements is shortened and adjacent memory function bodies come into contact with each other, information stored in each memory function body is not lost unlike the case where the memory function body is made from a conductor. Also, it becomes possible to dispose a contact plug closer to the memory function body, or in some cases it becomes possible to dispose the contact plug so as to overlap with the memory function body, which facilitates miniaturization of the memory elements.

For further increase of the reliability relating to the memory holding, the insulator having a function of holding electric charges is not necessarily needed to be in the film shape, and insulators having the function of holding an electric charge may preferably be present in an insulating film in a discrete manner. More specifically, such insulators may be dispersed like dots within a material having difficulty in holding electric charges, such as silicon oxide.

Use of an insulator film containing inside a conductive film or a semiconductor layer as a charge holding portion enables free control of the quantity of electric charges injected into the conductor or the semiconductor, thereby facilitating achieving a multi-valued memory cell. Therefore, this arrangement is preferable.

Further, using an insulator film containing one or more conductor or semiconductor dots as a memory function body facilitates execution of write and erase operations by direct tunneling of electric charges, thereby reducing power consumption. This is advantageous.

Moreover, it is acceptable to use, as a memory function body, a ferroelectric film such as PZT (lead zirconate titanate) and PLZT (lead lanthanum zirconate titanate) whose polarization direction is changed by an electric field. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film high-speed write and erase is achievable. This is advantageous.

The insulation film, which constitutes the memory function body, should properly be a region for making it difficult for electric charges to escape or a film that has a function to make it difficult for electric charges to escape. Materials fulfilling the function of obstructing escape of electric charges include a silicon oxide.

Preferably, the charge retention film contained in the memory function body is formed on both sides of the gate electrode directly or through an insulating film, and it is disposed on the semiconductor substrate (a well region, a body region, or a source/drain region or a diffusion layer region) through the gate insulating film or the insulating film. The charge retention films on both sides of the gate electrode are preferably formed so as to cover all or part of side surfaces of the gate electrode directly or through the insulating film. In an application where the gate electrode has a recess portion on the lower edge side, the charge retention film may be formed so as to fill the entire recess portion or part of the recess portion directly or through the insulating film.

The diffusion region can be made to function as a source/drain region and has a conductivity type opposite to that of the semiconductor layer or the well region. A junction of the diffusion region and the semiconductor layer or the well region should preferably have a steep slope of impurity concentration. The reason for the above is that hot electrons and hot holes are efficiently generated at a low voltage, and high-speed operation can be achieved at a lower voltage. The junction depth of the diffusion region is not specifically limited and is allowed to be properly adjusted according to the performance and so on of the semiconductor storage device desired to be obtained. When a SOI substrate is employed as a semiconductor substrate, the diffusion region may have a junction depth smaller than the film thickness of the surface semiconductor layer. However, the diffusion region should preferably have a junction depth almost equal to the film thickness of the surface semiconductor layer.

The diffusion region may be arranged so as to overlap with the gate electrode end or arranged so as to meet the gate electrode end or arranged so as to be offset with respect to the gate electrode end. In particular, in the case of offset, the easiness of inversion of the offset region under the charge retaining film is largely changed by the quantity of charges accumulated in the memory function body when the voltage is applied to the gate electrode, increasing the memory effect and reducing the short-channel effect. Therefore, this arrangement is preferable. However, since a drive current between the diffusion regions (source and drain) is significantly reduced if the offset is excessive, it is preferred that the amount of offset, i.e., a distance from one gate electrode end to the nearer diffusion region in the direction of the gate length should preferably be shorter than the thickness of the charge retaining film in the direction parallel to the gate length direction. What is particularly important is that at least part of the film or region having the charge retention function in the memory function body overlaps with part of the diffusion region. The reason for the above is that the essence of the memory elements that constitute the semiconductor storage device of the present invention is to rewrite the storage by the electric field intersecting the memory function body due to a voltage difference between the gate electrode and the diffusion region existing only in the side wall portion of the memory function body.

The diffusion region may be partially extended to a position higher than the surface of the channel region, i.e., the lower surface of the gate insulation film. In this case, it is proper that a conductive film integrated with this diffusion region is constructed while being laminated on the diffusion region formed in the semiconductor substrate. As the conductive film, there can be enumerated, for example, semiconductor of polysilicon, amorphous silicon or the like, silicide, aforementioned metals, high-melting-point metals and so on. Among others, polysilicon is preferable. The reason for the above is that the polysilicon, of which the impurity diffusion speed is significantly greater than that of the semiconductor layer, easily tolerates a shallowed junction depth of the diffusion region in the semiconductor layer and easily suppresses the short-channel effect. In this case, it is preferable to provide an arrangement that part of this diffusion region and the gate electrode hold at least part of the memory function body therebetween.

The memory element of the present invention can be formed by the ordinary semiconductor process according to a method similar to the method of forming a side wall spacer of a single layer or laminate structure on the side wall of the gate electrode. In concrete, there can be enumerated: a method for forming a gate electrode, thereafter forming a single layer film or a multilayer film including a film having the charge retention function (hereinafter referred to as a "charge retaining film"), a charge retaining film such as a charge retaining film/insulation film, an insulation film/charge retaining film and an insulation film/charge retaining film/insulation film and leaving these films in a side wall spacer shape by etching back under appropriate conditions; a method for forming an insulation film or a charge retaining film, leaving the films in a side wall spacer shape by etching back under appropriate conditions, further forming a charge retaining film or an insulation film and leaving the films in a side wall spacer shape by etching back under appropriate conditions; a method for coating or depositing an insulation film material in which a particulate charge retaining material is distributed on a semiconductor layer including a gate electrode, and leaving the insulation film material in a side wall spacer shape by etching back under appropriate conditions; a method for forming a gate electrode, thereafter forming the single layer film or the multilayer film and carrying out patterning by using a mask and so on. Moreover, there can be enumerated a method for forming a charge retaining film, a charge retaining film/insulation film, an insulation film/charge retaining film, an insulation film/charge retaining film/insulation film and so on before forming the gate electrode, forming an opening in a region that becomes a channel region of these films, forming a gate electrode material film on the entire upper surface and patterning this gate electrode material film in a shape, which is larger than the opening and includes the opening and so on.

One example of the formation process of this memory element will be described.

First, a gate insulation film and a gate electrode are formed on a semiconductor substrate according to a well-known procedure. Subsequently, a silicon oxide film is formed by the thermal oxidation method to a film thickness of 0.8 to 20 nm, or more preferably to a film thickness of 3 to 10 nm or deposited by the CVD (Chemical Vapor Deposition) method on the entire upper surface of the semiconductor substrate. Next, a silicon nitride film is deposited by the CVD method to a film thickness of 2 to 15 nm or more preferably to a film thickness of 3 to 10 nm on the entire upper surface of the silicon oxide film. Further, a silicon oxide film is deposited to a film thickness of 20 to 70 nm on the entire surface of the silicon nitride film by the CVD method.

Subsequently, by etching back the silicon oxide film/silicon nitride film/silicon oxide film by anisotropic etching, a memory function body appropriate for storage is formed in a side wall spacer shape on the side wall of the gate electrode.

Subsequently, by injecting ions using the gate electrodes and the memory function body in the side wall spacer shape used as a mask, a diffusion region (source/drain region) is formed. Subsequently, it is proper to carry out a silicide process or an upper portion wiring process according to a well-known procedure.

When a memory cell array is constructed by arranging the memory elements of the present invention, the best mode of the memory elements is to satisfy, for example, all the required conditions:

(1) the function of the word line is possessed by the integrated body of the gate electrodes of a plurality of memory elements;

(2) the memory function bodies are formed on both sides of the word line;

(3) electric charges in the memory function bodies are retained by an insulator, or in particular, a silicon nitride film;

(4) the memory function bodies are constructed of an ONO (Oxide Nitride Oxide) film, and the silicon nitride film has a surface roughly parallel to the surface of the gate insulation film;

(5) the silicon nitride film in each memory function body is separated by the word line, the channel region and the silicon oxide film;

(6) the silicon nitride film in each memory function body overlaps with the diffusion region;

(7) the thickness of the insulation film, which separates the silicon nitride film that has a surface roughly parallel to the surface of the gate insulation film from the channel region or the semiconductor layer differs from the thickness of the gate insulation film;

(8) write and erase operations of one memory element are executed by a single word line;

(9) there is no electrode (word line) that has a function to assist the write and erase operations on each memory function body; and

(10) the portion put in contact with the diffusion region right under each memory function body has a region where the impurity concentration of the conductive type opposite to the conductive type of the diffusion region is high. It is to be noted that the memory elements may satisfy at least one of these requirements.

The most preferable combination of the aforementioned requirements resides, for example, in that (3) electric charges in the memory function bodies are retained by an insulator, or in particular, a silicon nitride film, (6) the insulation film (silicon nitride film) in each memory function body overlaps with the diffusion region, and (9) there is no electrode (word line) that has a function to assist the write and erase operations on each memory function body.

When the requirement (3) and the requirement (9) are satisfied, the memory elements are very useful as follows.

First of all, a bit line contact can be arranged closer to the memory function body located on the word line side wall, or even if the memory elements are put close to each other in distance, the plurality of memory function bodies do not interfere with one another, and the storage information can be retained. Therefore, the miniaturization of the memory elements is facilitated. When the charge retaining region in the memory function body is a conductor, interference occurs between the charge retaining regions as the distance between the memory elements is reduced by capacitive coupling, and the storage information cannot be retained.

Moreover, when the charge retaining region in the memory function body is an insulator (e.g., silicon nitride film), there is no need to make each memory function body independent of each memory cell. For example, the memory function bodies formed on both sides of one word line shared by a plurality of memory cells are not required to be isolated every memory cell, and it is possible to share the memory function bodies formed on both sides of one word line by a plurality of memory cells that share the word line. Therefore, the photoetching process for isolating the memory function bodies become unnecessary, and the manufacturing process is simplified. Furthermore, the position alignment margin of the photolithography process and the film etching margin become unnecessary. Therefore, the margin between the memory cells can be reduced. Therefore, even if the formation is carried out on the same microfabrication level, the memory cell occupation area can be miniaturized in comparison with the case where the charge retaining region in the memory function body is a conductor (e.g., polycrystalline silicon film). When the charge retaining region in the memory function body is a conductor, there is needed a photoetching process for separating the memory function bodies every memory cell, and there are needed a photo position alignment margin and a film etching margin.

Furthermore, since there is a simple element structure that has no electrode having the function to assist the write and erase operations on the memory function bodies, the number of processes is reduced, and the yield can be improved. Therefore, consolidation with the transistors that constitute a logic circuit and an analog circuit can be facilitated, and an inexpensive semiconductor storage device can be obtained.

Moreover, the device is more useful when the requirements (3) and (9) are satisfied and the requirement (6) is satisfied. That is, by making the charge retaining region and the diffusion region in each memory function body overlap with each other, the write and erase operations can be executed at a very low voltage. In concrete, the write and erase operations can be executed at a low voltage of not higher than 5 V. This operation produces a very large effect in terms of circuit design. There is no need to make a high voltage in a chip dissimilarly to the flash memory, and therefore, the charge pump circuit, which requires an enormous occupation area, can be eliminated or reduced in scale. Particularly, when a small-scale capacity memory for adjustment is built in a logic LSI, the occupation area of the memory section is dominated by the occupation area of the peripheral circuit for driving the memory cells than the memory cells. Therefore, it is most effective to eliminate or reduce the scale of the memory cell voltage booster circuit in order to reduce the chip size.

On the other hand, when the requirement (3) is not satisfied or when electric charges are retained by a conductor in the memory function body, the write (program) operation can be executed even when the requirement (6) is not satisfied, or when the conductor in the memory function body and the diffusion region do not overlap with each other. This is because the conductor in the memory function body executes write assist by capacitive coupling with the gate electrode (write electrode).

Moreover, when the requirement (9) is not satisfied, or when there is an electrode that has the function to assist the write and erase operations on the memory function body, the write operation can be executed even when the requirement (6) is not satisfied, or when the insulator in the memory function body and the diffusion region do not overlap with each other.

In the semiconductor storage device of the present invention, the memory element may be connected in series to a transistor on one side or both sides or consolidated with a logic transistor on an identical chip. In the above case, the semiconductor device of the present invention, or in particular, the memory element can be formed through processes that has very high affinity for the formation processes of ordinary standard transistors of transistors, logic transistors and the like, and therefore, they can be concurrently formed. Therefore, the process of consolidating the memory elements with the transistors or the logic transistors becomes very simple, and an inexpensive consolidated device can be obtained.

In the semiconductor storage device of the present invention, the memory element can store binary or more information in one memory function body, and this allows the element to function as a memory element that stores four values or more information. The memory element may store only binary information. Moreover, it is possible to make the memory element function as a memory cell that has both the functions of a select transistor and a memory transistor by the variable resistor effect of the memory function body.

By being combined with a logic element, a logic circuit or the like, the semiconductor storage device of the present invention can be effectively widely applied to data processing systems of personal computers, notebook type computers, laptop type computers, personal assistant/transmitters, mini computers, workstations, mainframes, multi-processor computers or any other types of computers; electronic components that constitute a data processing system, such as CPU's, memories and data storage devices; communication equipment such as telephones, PHS's (Personal Handy phone Systems), modems and routers; image display equipment such as display panels and projectors; business machines such as printers, scanners and copiers; imaging equipment such as video cameras and digital cameras; amusement equipment such as game machines and music players; information equipment of portable information terminals, watches and electronic dictionaries; car equipment such as car navigation systems and car audio devices; AV (Audio Visual) equipment for recording and reproducing information of animations, still pictures and music; electrical appliances such as washing machines, microwave ovens, refrigerators, rice cookers, dish washers, vacuum cleaners and air conditioners; healthcare equipment such as massage machines, scales and sphygmomanometers; and electronic equipment such as portable storage devices of IC cards, memory cards and so on. In particular, the applications to the portable electronic equipment of portable telephones, portable information terminals, IC cards, memory cards, portable computers, portable game machines, digital cameras, portable animation players, portable music players, electronic dictionaries and watches are effective. It is to be noted that the semiconductor storage device of the present invention may be built in electronic equipment as at least part of a control circuit or a data storage circuit, or detachably mounted thereto at need.

Embodiments of the semiconductor storage device and the portable electronic equipment of the present invention will be described in detail below with reference to the drawings.

(First Embodiment)

The semiconductor storage device of this embodiment is provided with a memory element 1001 that serves as one example of the nonvolatile memory element as shown in FIG. 1.

In the memory element 1001, a gate electrode 1104 is formed on a P-type well region 1102 formed via a gate insulation film 1103 on the surface of a semiconductor substrate 1101. A silicon nitride film 1109, which has a trap level for retaining electric charges and serves as a charge retaining film, is arranged on the upper surface and the side surfaces of the gate electrode 1104, and the portions of the silicon nitride film 1109 located on both side walls of the gate electrode 1104 serve as memory function bodies 1105*a* and 1105*b* for actually retaining electric charges. In this case, the memory function body means a portion where electric charges are actually accumulated by the rewrite operation in the memory function body or the charge retaining film. N-type diffusion regions 1107*a* and 1107*b*, which function as a source region and a drain region, respectively, are formed on both sides of the gate electrode 1104 and inside the P-type well region 1102. The diffusion regions 1107*a* and 1107*b* have an offset structure. That is, the diffusion regions 1107*a* and 1107*b* do not reach the region 1121 located under the gate electrode, and the offset regions 1120 under the charge retaining film (silicon nitride film 1109) constitute part of the channel region.

Figure 2B:
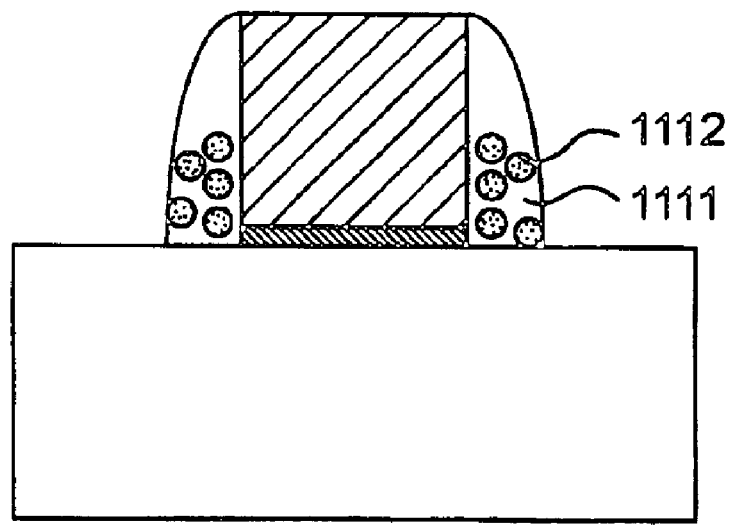

It is to be noted that the memory function bodies 1105*a* and 1105*b*, which substantially retain electric charges, are both sides wall portions of the gate electrode 1104. Therefore, the silicon nitride film 1109 is only required to be formed in the regions corresponding to these portions (see FIG. 2A). Moreover, the memory function bodies 1105*a* and 1105*b* may have a structure in which particles 1112 constructed of a conductor or a semiconductor of a nanometer size are distributed in scattered dots in an insulation film 1111 (see FIG. 2B). In this case, it is difficult for an electric charge to tunnel its way through the dots since the quantum effect is excessive when the particle 1112 has a size smaller than 1 nm, and no remarkable quantum effect appears at the room temperature when the size exceeds 10 nm. Therefore, the diameter of the particle 1112 should preferably be within a range of 1 nm to 10 nm. Furthermore, the silicon nitride films 1109, which become charge retaining films, may be formed in a side wall spacer shape on the side surfaces of the gate electrode (see FIG. 3).

The principle of write operation of the memory element will be described with reference to FIG. 3 and FIG. 4. In this case, the description is based on the case where the entire bodies of the memory function bodies 1131*a* and 1131*b* have a function to retain electric charges. Moreover, the term of "write" means the injection of electrons into the memory function bodies 1131*a* and 1131*b* when the memory element is the N-channel type. Hereinafter, the description is provided on the assumption that the memory element is the N-channel type.

Figure 3:
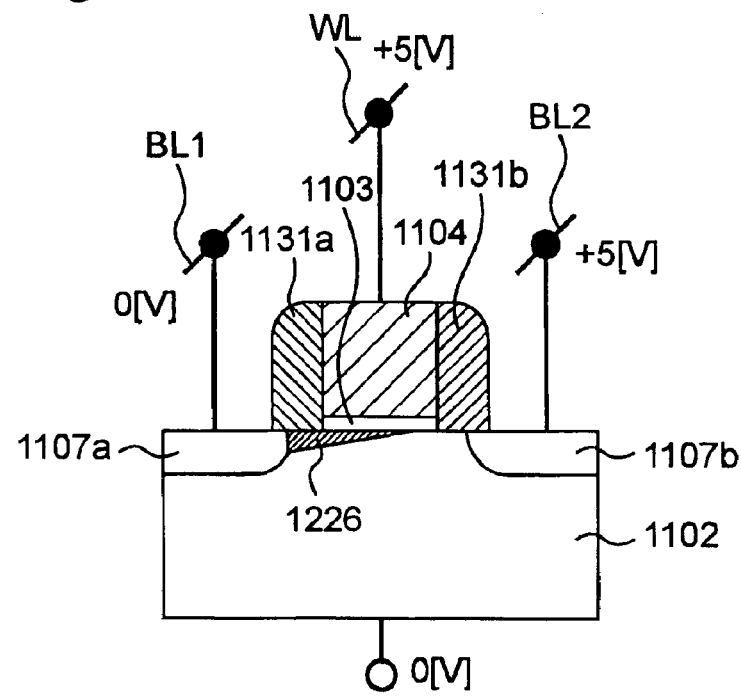
FIG. 3 is a view for explaining the write operation of the memory element in the semiconductor storage device of the first embodiment.

In order to inject an electron (execute write) into the second memory function body 1131*b*, as shown in FIG. 3, an N-type first diffusion region 1107*a* and an N-type second diffusion region 1107*b* are made to serve as a source electrode and a drain electrode, respectively. For example, a voltage of 0 V is applied to the first diffusion region 1107*a* and the P-type well region 1102, a voltage of +5 V is applied to the second diffusion region 1107b, and a voltage of +5 V is applied to the gate electrode 1104. According to the above-mentioned voltage conditions, an inversion layer 1226 extends from the first diffusion region 1107a (source electrode), but it does not reach the second diffusion region 1107b (drain electrode), generating a pinch-off point. An electron is accelerated from the pinch-off point to the second diffusion region 1107b (drain electrode) by a high electrical field and becomes a so-called hot electron (high energy conduction electron). Write is executed by the injection of this hot electron into the second memory function body 1131b. Since no hot electron is generated in the vicinity of the first memory function body 1131a, write is not executed.

Figure 4:
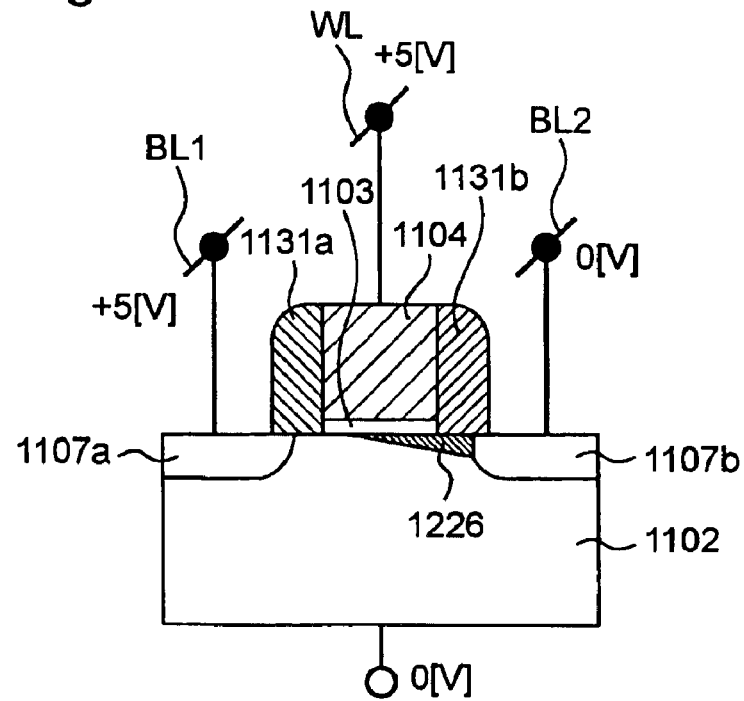
FIG. 4 is a view for explaining the write operation of the memory element in the semiconductor storage device of the first embodiment.

On the other hand, in order to inject an electron (execute write) into the first memory function body 1131a, as shown in FIG. 4, the second diffusion region 1107b and the first diffusion region 1107a are made to serve as the source electrode and the drain electrode, respectively. For example, a voltage of 0 V is applied to the second diffusion region 1107b and the P-type well region 1102, a voltage of +5 V is applied to the first diffusion region 1107a, and a voltage of +5 V is applied to the gate electrode 1104. As described above, by exchanging the source and drain regions reversely to the case where an electron is injected into the second memory function body 1131b, write can be executed by injecting an electron into the first memory function body 1131a.

Next, the principle of erase operation of the memory element will be described with reference to FIG. 5 and FIG. 6.

Figure 5:
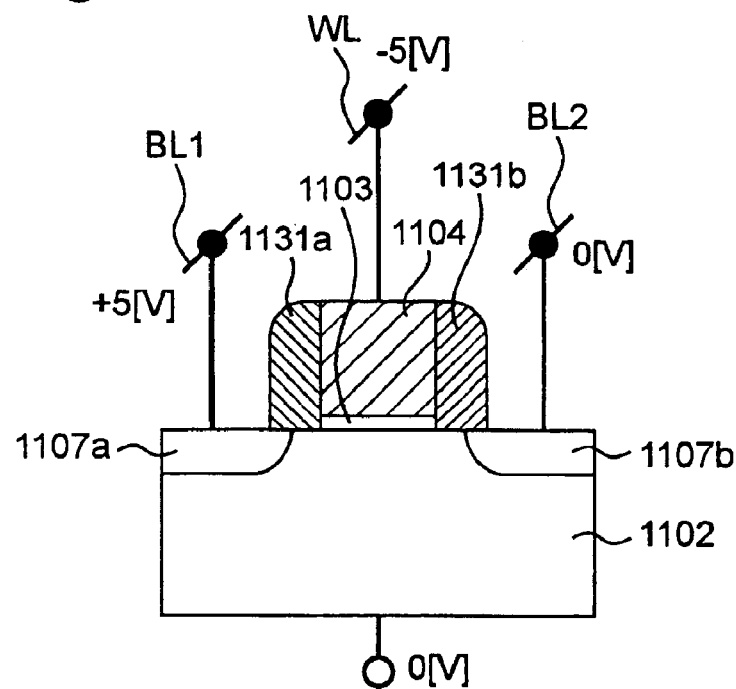
FIG. 5 is a view for explaining the erase operation of the memory element in the semiconductor storage device of the first embodiment.

According to a first method for erasing the information stored in the first memory function body 1131a, as shown in FIG. 5, a positive voltage (e.g., +5 V) is applied to the first diffusion region 1107a, a voltage of 0 V is applied to the P-type well region 1102, a reverse bias is applied to a PN junction of the first diffusion region 1107a and the P-type well region 1102, and a negative voltage (e.g., −5 V) is further applied to the gate electrode 1104. At this time, the potential slope becomes steep, in particular, in the vicinity of the gate electrode 1104 at the PN junction due to the influence of the gate electrode to which the negative voltage is applied. Accordingly, a hot hole (high energy hole) is generated on the P-type well region 1102 side of the PN junction due to band-to-band tunneling. This hot hole is drawn toward the gate electrode 1104 that has a negative potential, and consequently, the hole is injected into the first memory function body 1131a. As described above, the erase of the first memory function body 1131a is executed. In this case, it is proper to apply a voltage of 0 V to the second diffusion region 1107b.

When erasing the information stored in the second memory function body 1131b, it is proper to exchange the potential of the first diffusion region with the potential of the second diffusion region in the aforementioned case.

Figure 6:
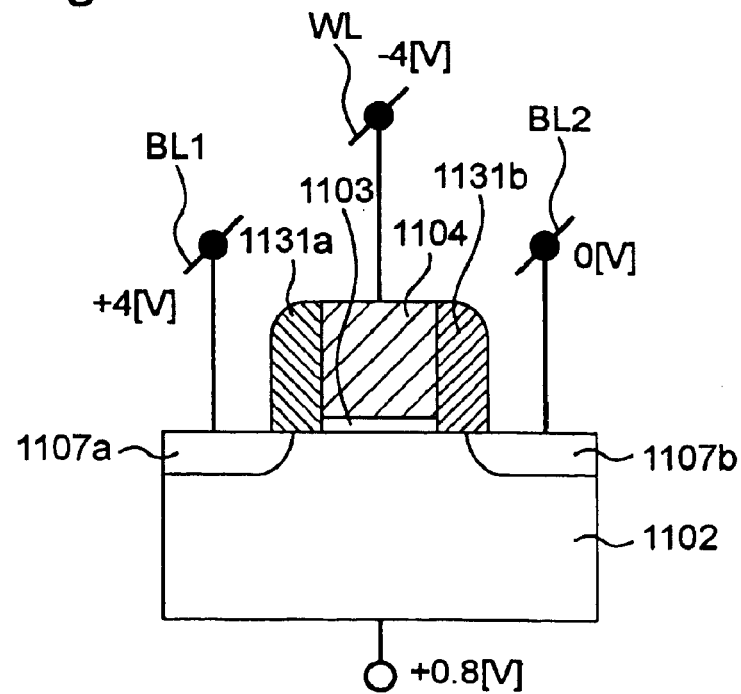
FIG. 6 is a view for explaining the erase operation of the memory element in the semiconductor storage device of the first embodiment.

According to a second method for erasing the information stored in the first memory function body 1131a, as shown in FIG. 6, a positive voltage (e.g., +4 V) is applied to the first diffusion region 1107a, a voltage of 0 V is applied to the second diffusion region 1107b, a negative voltage (e.g., −4 V) is applied to the gate electrode 1104, and a positive voltage (e.g., +0.8 V) is applied to the P-type well region 1102. In this case, a forward voltage is applied across the P-type well region 1102 and the second diffusion region 1107b, injecting an electron into the P-type well region 1102. The injected electron diffuses to a PN junction of the P-type well region 1102 and the first diffusion region 1107a and become hot electrons by being accelerated there by an intense electric field. This hot electron generates an electron-hole pair at the PN junction. That is, by applying the forward voltage across the P-type well region 1102 and the second diffusion region 1107b, the electron injected into the P-type well region 1102 becomes a trigger to generate a hot hole at the PN junction located on the opposite side. The hot hole generated at the PN junction is drawn toward the gate electrode 1104 that has a negative potential, and consequently, the hole is injected into the first memory function body 1131a.

According to this method, even when only a voltage insufficient for the generation of a hot hole by band-to-band tunneling is applied to the PN junction of the P-type well region and the first diffusion region 1107a, the electron injected from the second diffusion region 1107b becomes a trigger to generate an electron-hole pair at the PN junction, allowing a hot hole to be generated. Therefore, the voltage during the erase operation can be lowered. Particularly, when an offset region 1120 (see FIG. 1) exists, the effect that the PN junction becomes steep due to the gate electrode to which the negative potential is applied is a little, and therefore, it is difficult to generate a hot hole by band-to-band tunneling. The second method makes up for the defect, and the erase operation can be achieved at a low voltage.

In erasing the information stored in the first memory function body 1131a, a voltage of +5 V must to be applied to the first diffusion region 1107a according to the first erase method, whereas a voltage of +4 V is sufficient according to the second erase method. As described above, according to the second method, the voltage during erase can be reduced. Therefore, power consumption is reduced, and the deterioration of the memory element due to the hot carrier can be restrained.

Moreover, by either one of the erase methods, overerase does not easily occur in the memory element. The term of "overerase" here is a phenomenon that the threshold value is lowered without saturation as the amount of holes accumulated in the memory function body increases. This is a serious problem in EEPROM (Electrically Erasable Programmable Read-Only Memory) represented by a flash memory, and there occurs a fatal malfunction that memory cell selection becomes impossible particularly when the threshold value becomes negative. On the other hand, in the memory element of the semiconductor storage device of the present invention, only electrons are induced under the memory function bodies even when a large amount of holes are accumulated in the memory function body, and almost no influence is exerted on the potential of the channel region under the gate insulation film. The threshold value during erase is determined by the potential under the gate insulation film, and therefore, overerase does not easily occur.

Figure 7:
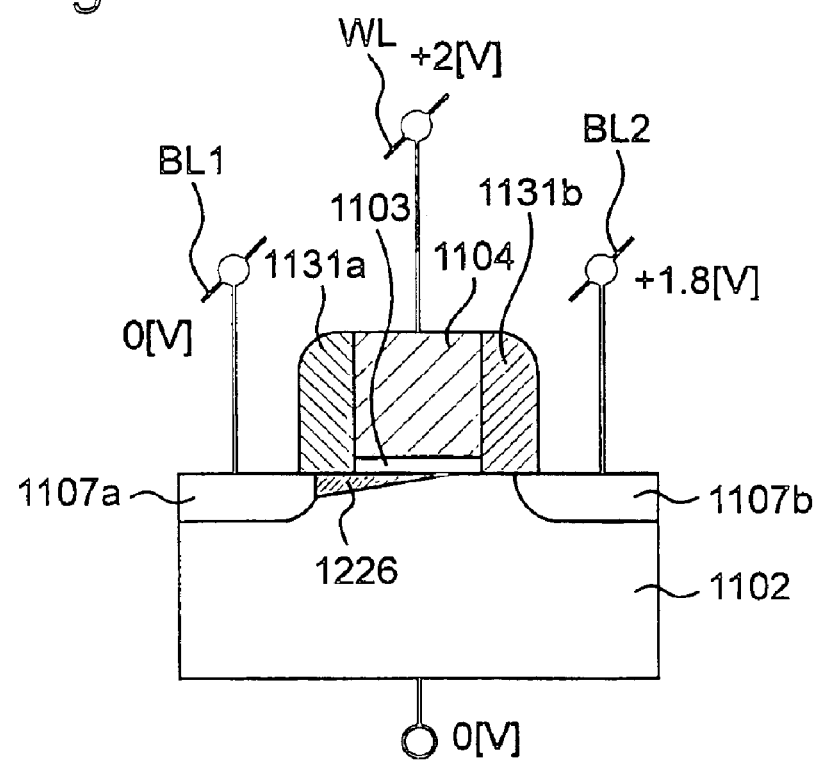
FIG. 7 is a view for explaining the read operation of the memory element of the semiconductor storage device of the first embodiment.

The principle of read operation of the memory element will be further described with reference to FIG. 7.

In reading the information stored in the first memory function body 1131a, the transistor is operated by making the first diffusion region 1107a and the second diffusion region 1107b serve as a source electrode and a drain electrode, respectively. For example, a voltage of 0 V is applied to the first diffusion region 1107a and the P-type well region 1102, a voltage of +1.8 V is applied to the second diffusion region 1107b, and a voltage of +2 V is applied to the gate electrode 1104. In this case, when no electron is accumulated in the first memory function body 1131a, a drain current easily flows. When electrons are accumulated in the first memory function body 1131a, the inversion layer is not easily formed in the vicinity of the first memory function body 1131a, and therefore, a drain current hardly flows. Therefore, by detecting the drain current, the storage information of the first memory function body 1131a can be read. In particular, when read is executed by giving a voltage that causes the pinch-off operation, the state of charges accumulated in the first memory function body 1131a can be more accurately determined without being influenced by the presence or absence of charges in the memory function body 1131b.

In reading the information stored in the second memory function body 1131b, the transistor is operated by making the second diffusion region 1107b and the first diffusion region 1107a serve as the source electrode and the drain electrode, respectively. Although not shown, it is proper to apply, for example, a voltage of 0 V to the second diffusion region 1107b and the P-type well region 1102, apply a voltage of +1.8 V to the first diffusion region 1107a and apply a voltage of +2 V to the gate electrode 1104. As described above, by exchanging the source and drain regions reversely to the case where the information stored in the first memory function body 1131a is read, the information stored in the second memory function body 1131b can be read.

If the channel region (offset regions 1120) that is not covered with the gate electrode 1104 is left, then the inversion layer is lost or formed depending on the presence or absence of surplus electric charges of the memory function bodies 1131a and 1131b in the channel region that is not covered with the gate electrode 1104, and consequently, a great hysteresis (a change in the threshold value) is obtained. It is to be noted that the drain current is largely reduced when the width of the offset region 1120 is excessively large, and the read speed is significantly slowed. Therefore, it is preferable to determine the width of the offset region 1120 so that sufficient hysteresis and read speed can be obtained.

Even when the diffusion regions 1107a and 1107b reached the ends of the gate electrode 1104, i.e., even when the diffusion regions 1107a and 1107b and the gate electrode 1104 overlapped with each other, the threshold value of the transistor was scarcely changed by the write operation. However, a parasitic resistance at the ends of the source and drain is largely changed, and the drain current is largely reduced (by an order of magnitude or more). Therefore, read can be executed by detecting the drain current, and a function as a memory can be obtained. However, when a larger memory hysteresis effect is needed, it is preferred that the diffusion regions 1107a and 1107b do not overlap with the gate electrode 1104 (the offset region 1120 exists).

By the aforementioned operation method, 2-bit write and erase per transistor can be selectively achieved. Moreover, by arranging memory elements with a word line WL connected to the gate electrodes 1104 of the memory elements and with a first bit line BL1 and a second bit line BL2 connected to the first diffusion regions 1107a and the second diffusion regions 1107b, respectively, a memory cell array can be constructed.

Moreover, according to the aforementioned operation method, the 2-bit write and erase per transistor are executed by exchanging the source electrode with the drain electrode. However, the device may be operated as a 1-bit memory by fixing the source electrode and the drain electrode. In this case, it is possible to make one of the source and drain regions have a common fixed voltage, and the number of bit lines connected to the source and drain regions can be reduced by half.

As is apparent from the above description, in the memory element of the semiconductor storage device of the present invention, the memory function bodies are formed independently of the gate insulation film and formed on both sides of the gate electrode, and therefore, the 2-bit operation can be achieved. Moreover, the memory function bodies are separated by the gate electrode, and therefore, interference during rewrite is effectively restrained. Furthermore, the gate insulation film, which is separated from the memory function body, can therefore restrain the short-channel effect by being reduced in film thickness. Therefore, the miniaturization of the memory element and also the semiconductor storage device is facilitated.

Moreover, in the drawings, the same reference numerals are given to the portions where the same material and substances are used and do not necessarily indicate the same shapes.

Moreover, it is to be noted that the drawings are schematic, and the dimensional relations between thickness and plane, ratios of thickness and size between layers and portions and so on are different from those of the actual ones. Therefore, the concrete dimensions of thickness and size should be determined in consideration of the following description. Moreover, there are, of course, included the portions whose mutual dimensional relations and ratios are different between the figures.

Moreover, the thickness and the size of the layers and portions described in the present patent specification are the dimensions of the final shapes in the stage in which the formation of the semiconductor device is completed unless specifically described. Therefore, it is to be noted that the dimensions of the final shapes somewhat change depending on the thermal history and so on of the subsequent processes in comparison with the dimensions immediately after the formation of the films, the impurity regions and so on.

(Second Embodiment)

Figure 8:
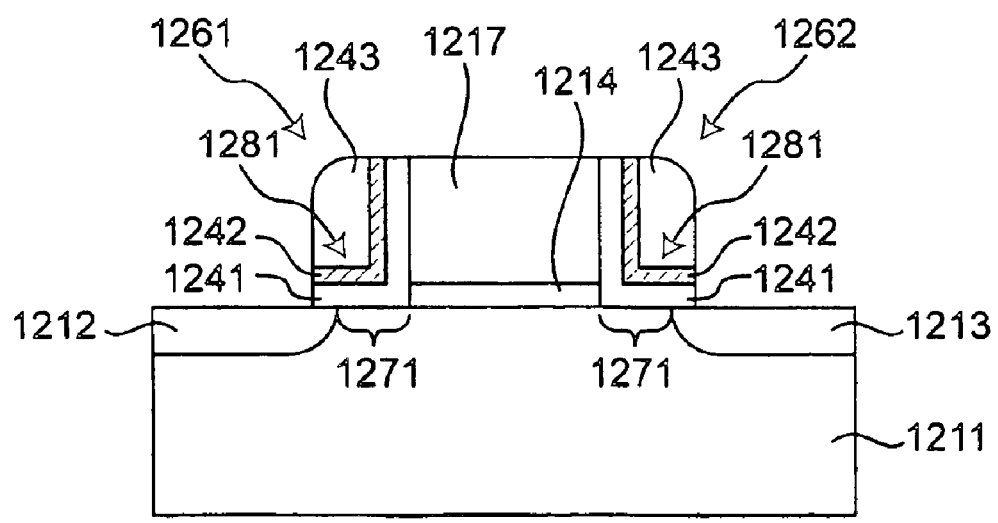
FIG. 8 is a schematic sectional view of an essential part of a memory element in a semiconductor storage device of a second embodiment of the present invention.

As shown in FIG. 8, the memory element in the semiconductor storage device of the present embodiment has a construction substantially similar to that of the memory element 1001 of FIG. 1 except for the memory function bodies 1261 and 1262 are constructed of a region for retaining electric charges (this may be a region for storing electric charges, or a film having the function to retain electric charges) and a region for restraining the escape of electric charges (this may be a film that has a function to restrain the escape of electric charges).

From the point of view of improving the retention characteristic of the memory, the memory function body should preferably include a charge retaining film having the function to retain electric charges and an insulation film. This embodiment employs a silicon nitride film 1242 that has a level for trapping electric charges as a charge retaining film and silicon oxide films 1241 and 1243 that have the operation of preventing the dissipation of electric charges accumulated in the charge retaining film as an insulation film. By the memory function body that including the charge retaining film and the insulation film, the retention characteristic can be improved by preventing the dissipation of electric charges. Moreover, the volume of the charge retaining film can be moderately reduced in comparison with the case where the memory function body is constructed only of the charge retaining film, and the occurrence of a characteristic change due to the movement of electric charges during the retention of the storage can be restrained by limiting the movement of electric charges in the charge retaining film. Furthermore, with the structure in which the silicon nitride film 1242 is held between the silicon oxide films 1241 and 1243, charge injection efficiency during the rewrite operation is increased, and higher-speed operation becomes possible. In this memory element, the silicon nitride film 1242 may be replaced by a ferroelectric substance.

Also, the region (silicon nitride film 1242) for holding electric charges in the memory function bodies 1261, 1262 are overlapped with the diffusion layer regions 1212, 1213. Herein, the term "overlap" is used to refer to the state that at least part of the region (silicon nitride film 1242) for holding electric charges is present on at least part of the diffusion layer regions 1212, 1213. It is noted that there are shown a semiconductor substrate 1211, a gate insulating film 1214, and an offset region 1271 between the gate electrode 1217 and the diffusion layer regions 1212, 1213. Though unshown in the drawing, the uppermost surface of the semiconductor substrate 1211 under the gate insulating film 1214 is a channel region.

An effect produced by the arrangement that the silicon nitride film 1242 serving as the region for retaining electric charges in the memory function bodies 1261 and 1262 overlap with the diffusion regions 1212 and 1213 will be described.

Figure 9:
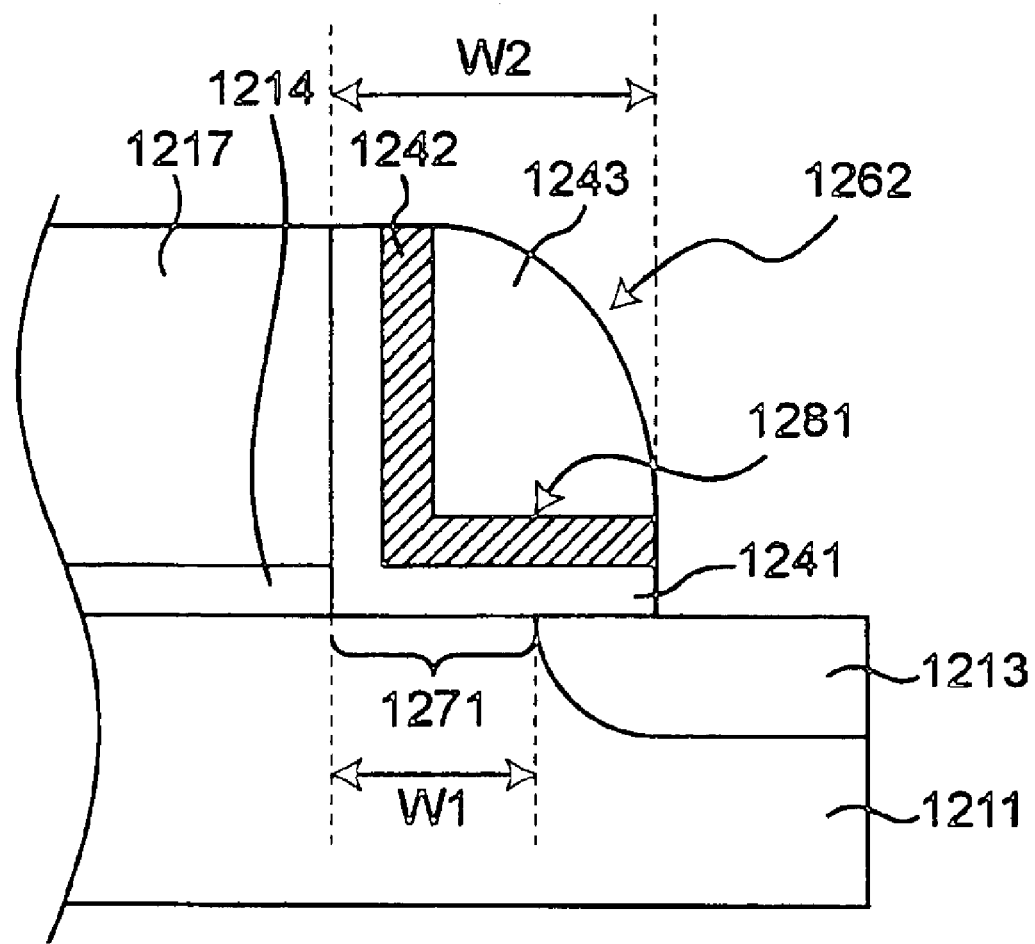
FIG. 9 is an enlarged schematic sectional view of the essential part of the semiconductor storage device of the second embodiment.

As shown in FIG. 9, assuming that the amount of offset of a gate electrode 1217 with respect to a diffusion region 1213 is W1 and that the width of a memory function body 1262 in a cross-sectional plane in the channel-length direction of the gate electrode 1217 is W2 in the peripheral portions of the memory function body 1262, then the amount of overlap of the memory function body 1262 with the diffusion region 1213 is expressed by W2−W1. What is important here is that the memory function body 1262 constructed of the silicon nitride film 1242 of the memory function body 1262 overlaps with the diffusion region 1213, i.e., the arrangement that the relation: W2>W1 is satisfied.

In FIG. 9, the end of the silicon nitride film 1242 remote from the gate electrode 1217 coincided with the end of the memory function body 1262 remote from the gate electrode 1217 at the memory function body 1262. Therefore, the width of the memory function body 1262 was defined as W2.

Figure 10:
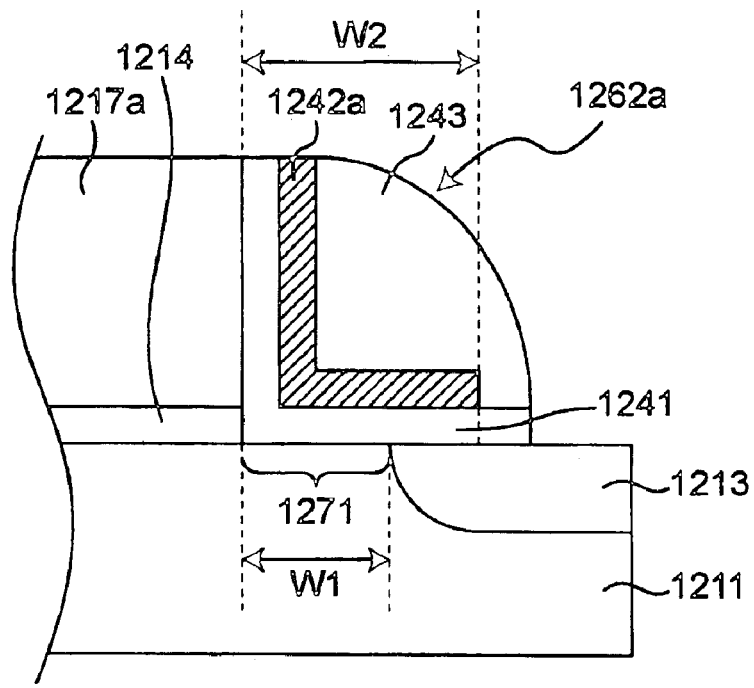
FIG. 10 is an enlarged schematic sectional view of an essential part of a modification of the semiconductor storage device of the second embodiment.

In the case where an edge of a silicon nitride film 1242a on the side away from the gate electrode in a memory function body 1262a is not aligned with an edge of the memory function body 1262a on the side away from the gate electrode as shown in FIG. 10, W2 may be defined as the width from the edge of the gate electrode to the edge of the silicon nitride film 1242a on the side away from the gate electrode.

Figure 11:
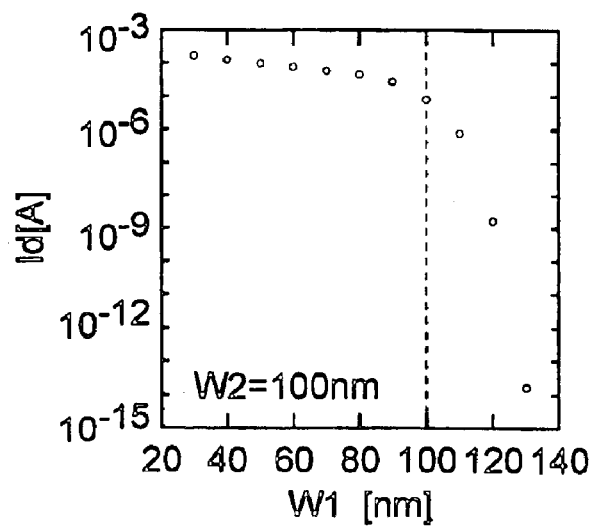
FIG. 11 is a graph showing the electrical characteristic of the memory element in the semiconductor storage device of the second embodiment.

FIG. 11 shows a drain current Id in the structure of FIG. 9 with the width W2 of the memory function body 1262 being fixed to 100 nm and the offset amount W1 being varied. Herein, the drain current is obtained by device simulation performed under the conditions that the memory function body 1262 is in erase state (positive holes are stored), and the diffusion layer regions 1212, 1213 are set to be a source electrode and a drain electrode, respectively. As shown in FIG. 11, with W1 being 100 nm or more (i.e., when the silicon nitride film 1242 and the diffusion layer region 1213 are not overlapped), the drain current shows rapid reduction. Since a drain current value is almost in proportion to a read operation speed, memory performance is rapidly deteriorated when W1 is 100 nm or more. In the range where the silicon nitride film 1242 and the diffusion layer region 1213 are overlapped, the drain current shows mild reduction. Therefore, taking a manufacturing dispersion into consideration, it is difficult to obtain a memory function unless at least part of the silicon nitride film 1242 that is a film having a function of holing electric charges is overlapped with the source/drain region.

Based on the above-described result of the device simulation, a memory cell array is manufactured with W2 being fixed to 100 nm, and W1 being set to 60 nm and 100 nm as design values. When W1 is 60 nm, the silicon nitride film 1242 is overlapped with the diffusion layer regions 1212, 1213 by 40 nm as a design value, and when W1 is 100 nm, there is no overlap as a design value. As a result of measuring read time of these memory cell arrays in comparison with the worst cases in consideration to dispersion, it was found out that the case where W1 was 60 nm as a design value was 100 times faster in readout access time. From a practical standpoint, it is preferable that the read access time is 100 nanoseconds or less per bit. It was found out, however, that this condition was never satisfied in the case of W1=W2. It was also found out that W2−W1>10 nm was more preferable in consideration to manufacturing dispersion.

It is preferable for reading information stored in the memory function body 1261 (region 1281) to set the diffusion layer region 1212 as a source electrode and the diffusion layer region 1213 as a drain region similar to the embodiment 1 and to form a pinchoff point on the side closer to the drain region in the channel region. More specifically, in reading information stored in either one of two memory function bodies, the pinch-off point is preferably formed in a region closer to the other memory function body in the channel region. This makes it possible to detect memory information in the memory function body 1261 with good sensitivity regardless of the storage condition of the memory function body 1262, resulting in large contribution to implementation of two-bit operation.

In the case of storing information only in one side out of the two memory function bodies, or in the case of using these two memory function bodies in the same storing condition, an pinch-off point is not necessarily formed in read operation.

Although not shown in FIG. 8, a well region (P type well in the case of N-channel device) is preferably formed on the surface of the semiconductor substrate 1211. Forming the well region facilitates control of other electric characteristics (withstand voltage, junction capacitance, and short channel effect) while maintaining impurity concentration of the channel region optimum for memory operation (rewrite operation and read operation).

Figure 12:
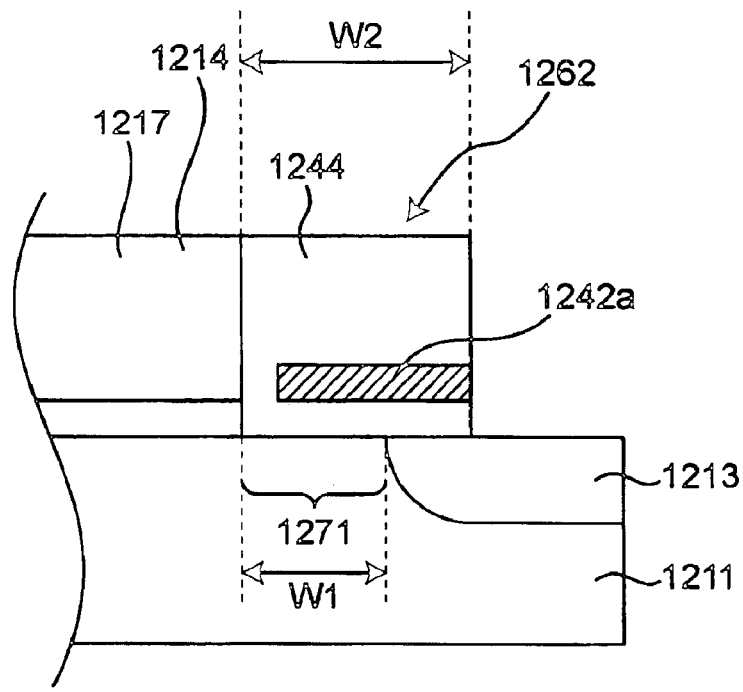
FIG. 12 is a schematic sectional view of an essential part of a modification of the memory element in the semiconductor storage device of the second embodiment.

Also, it is preferable that the memory function body contains a charge holding film disposed approximately parallel to the surface of the gate insulating film. In other words, it is preferable that the surface of the charge holding film in the memory function body is disposed so as to have a constant distance from the surface of the gate insulating film. More particularly, as shown in FIG. 12, a silicon nitride film 1242a as an electric holding film in the memory function body 1262 has a face approximately parallel to the surface of the gate insulating film 1214. In other words, the silicon nitride film 1242a is preferably formed to have a uniform height from the height corresponding to the surface of the gate insulating film 1214.

The presence of the silicon nitride film 1242a approximately parallel to the surface of the gate insulating film 1214 in the memory function body 1262 makes it possible to effectively control easiness of formation of an inversion layer in the offset region 1271 with use of an amount of electric charges stored in the charge holding film 1242a, thereby enabling increase of memory effect. Also, by placing the silicon nitride film 1242a approximately parallel to the surface of the gate insulating film 1214, change of memory effect may be kept relatively small even with a dispersed offset amount (W1), enabling restraint of memory effect dispersion. In addition, movement of electric charges toward upper side of the silicon nitride film 1242a may be suppressed, and therefore characteristic change due to the movement of electric charges during memory holding may be restrained.

Furthermore, the memory function body 1262 preferably contains an insulating film (e.g., a portion of the silicon oxide film 1244 on the offset region 1271) that separates the silicon nitride film 1242a approximately parallel to the surface of the gate insulating film 1214 from the channel region (or the well region). This insulating film may restrain dispersion of the electric charges stored in the charge holding film, thereby contributing to obtaining a memory device with better holding characteristics.

It is noted that controlling the film thickness of the silicon nitride film 1242a as well as controlling the film thickness of the insulating film under the silicon nitride film 1242a (a portion of the silicon oxide film 1244 on the offset region 1271) to be constant make it possible to keep the distance from the surface of the semiconductor substrate to the electric charges stored in the charge holding film approximately constant. More particularly, the distance from the surface of the semiconductor substrate to the electric charges stored in the charge holding film may be controlled to be within the range from a minimum film thickness value of the insulating film under the silicon nitride film 1242a to the sum of a maximum film thickness of the insulating film under the silicon nitride film 1242a and a maximum film thickness of the silicon nitride film 1242a. Consequently, the concentration of electric line of force generated by the electric charges stored in the silicon nitride film 1242a may be roughly controlled, and therefore dispersion of the degree of memory effect of the memory device may be minimized.

(Third Embodiment)

Figure 13:
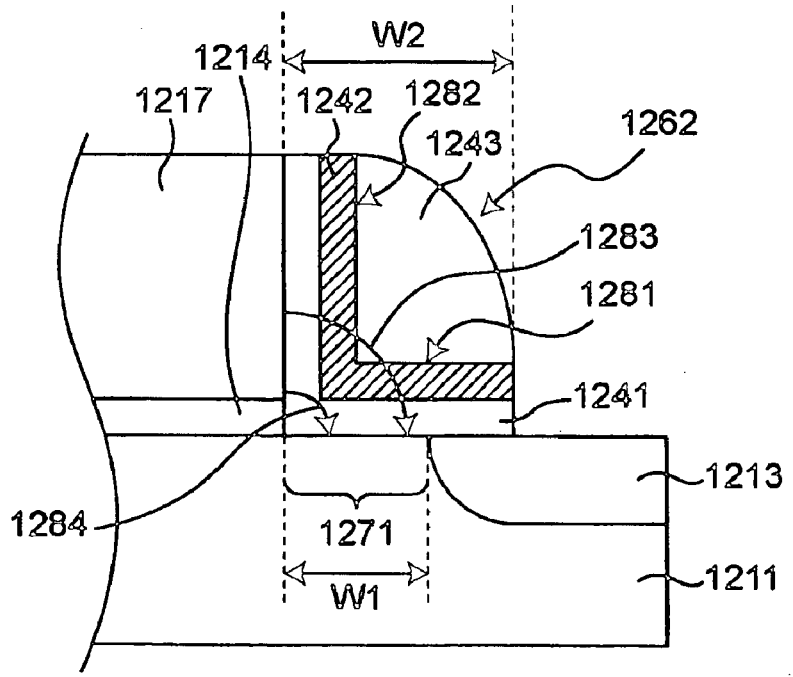
FIG. 13 is a schematic sectional view of an essential part of a memory element in a semiconductor storage device of a third embodiment of the present invention.

In this embodiment, a silicon nitride film 1242 as a film made of a first insulator in the charge holding portion 1262 has an approximately uniform film thickness as shown in FIG. 13. Further, the silicon nitride film 1242 as a charge holding film is configured such that a region 1281 having a constant thickness and disposed approximately parallel to the surface of the gate insulating film 1214 and a region 1282 extending in direction approximately parallel to the side face of the gate electrode 1217.

When a positive voltage is applied to the gate electrode 1217, electric line of force in the memory function body 1262 passes the silicon nitride film 1242 total two times through the first portion 1281 and the second portion 1282 as shown with an arrow 1283. It is noted that when a negative voltage is applied to the gate electrode 1217, the direction of electric line of force is reversed. Herein, a dielectric constant of the silicon nitride film 1242 is approx. 6, while a dielectric constant of silicon oxide films 1241, 1243 is approx. 4. Eventually, an effective dielectric constant of the memory function body 1262 in the direction of electric line of force (arrow 1283) becomes larger than that in the case where the charge holding film includes only the first portion 1281, which makes it possible to decrease potential difference between the both edges of the electric line of force. More specifically, much part of the voltage applied to the gate electrode 1217 is used to reinforce electric fields in the offset region 1271.

Electric charges are injected into the silicon nitride film 1242 in rewrite operation because generated electric charges are pulled by electric fields in the offset region 1271. As a consequence, the silicon nitride film 1242 including the second portion 1282 increases the electric charges injected into the memory function body 1262 in rewrite operation, thereby increasing a rewrite speed.

In the case where the portion of the silicon oxide film 1243 is a silicon nitride film, more specifically, in the case where the charge holding film is not flat against the height corresponding to the surface of the gate insulating film 1214, movement of electric charges toward upper side of the silicon nitride film becomes outstanding, and holding characteristics are deteriorated.

Instead of silicon nitride film, the charge holding film is more preferably formed from high-dielectric substances such as hafnium oxide having extremely large dielectric constant.

Further, the memory function body more preferably includes an insulating film (a portion of the s1241 on the silicon oxide film on the offset region 1271) that separates the charge holding film approximately parallel to the surface of the gate insulating film from the channel region (or the well region). This insulating film may restrain dispersion of the electric charges stored in the charge holding film, thereby enabling further improvement of holding characteristics.

Also, the memory function body more preferably includes an insulating film (a portion of the silicon oxide film 1241 in contact with the gate electrode 1217) that separates the gate electrode from the charge holding film extending in the direction approximately parallel to the side face of the gate electrode. This insulating film may prevent injection of electric charges from the gate electrode into the charge holding film and prevent change of electric characteristics, which may increase reliability of the memory device.

Further, similar to the second embodiment, it is preferable that the film thickness of the insulating film under the silicon nitride film 1242 (a portion of the silicon oxide film 1241 on the offset region 1271) is controlled to be constant, and further the film thickness of the insulating film disposed on the side face of the gate electrode (a portion of the silicon oxide film 1241 in contact with the gate electrode 1217) is controlled to be constant. Consequently, the concentration of electric line of force generated by the electric charges stored in the silicon nitride film 1242 may be roughly controlled, and leakage of electric charges may be prevented.

(Fourth Embodiment)

In this embodiment, optimization of the distance between a gate electrode, a memory function body, and a source/drain region is explained.

Figure 14:
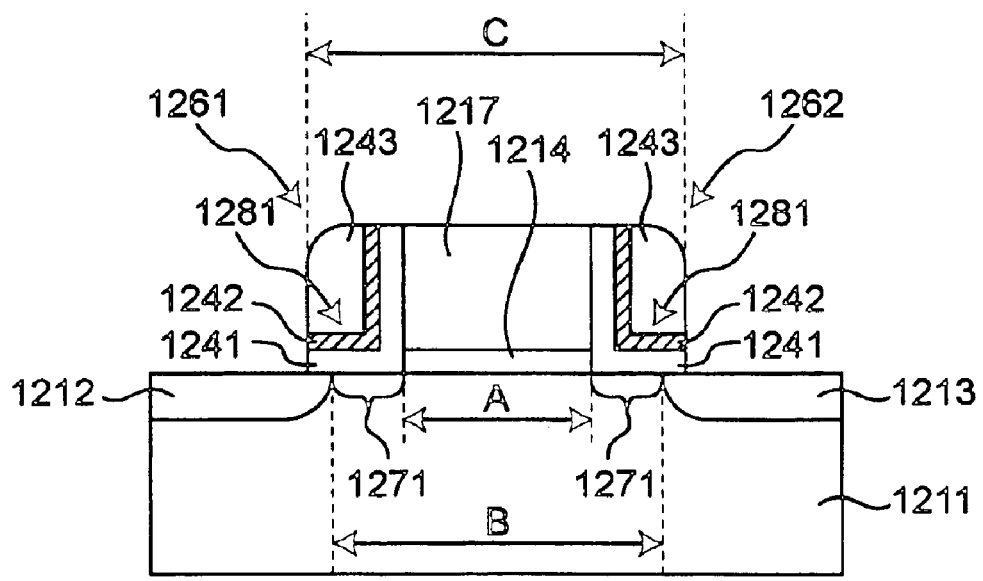
FIG. 14 is a schematic sectional view of an essential part of a memory element in a semiconductor storage device of a fourth embodiment of the present invention.

As shown in FIG. 14, reference symbol A denotes a gate electrode length in the cross section in channel length direction, reference symbol B denotes a distance (channel length) between source and drain regions, and reference symbol C denotes a distance from the edge of one memory function body to the edge of the other memory function body, more specifically a distance from the edge of a film (the side away from the gate electrode) having a function of holding the electric charges in one charge holding portion in the cross section in channel length direction to the edge of a film 1242 (the side away from the gate electrode 1217) having a function of holding the electric charges in the other memory function body 1262.

An equation A<B is preferable. When this equation is satisfied, in the channel region, there is present an offset region 1271 between a portion under the gate electrode 1217 and the source/drain regions 1212, 1213. Thereby, the electric charges stored in the memory function bodies 1261, 1262 (silicon nitride film 1242) effectively change easiness of inversion in the entire part of the offset region 1271. As a result, memory effect is increased, and high-speed read operation is particularly enabled.

Also, when the gate electrode 1217 and the source/drain regions 1212, 1213 are offset, that is when an equation A<B is satisfied, easiness of inversion of the offset region when a voltage is applied to the gate electrode 1217 is largely changed by an electric charge amount stored in the memory function bodies 1261, 1262. Consequently, memory effect increases and short channel effect can be reduced.

However, as long as the memory effect is effective, the offset region is not necessarily required. Even when the offset region 1271 is not present, if the impurity concentration in the source/drain regions 1212, 1213 is sufficiently small, the memory effect can still be effective in the memory function bodies 1261, 1262 (silicon nitride film 1242).

As described referring to FIG. 11, a memory function can not be obtained unless at least part of the silicon nitride film 1242a is overlapped with the source/drain region 1212, 1213. Consequently, the equation B<C is preferably satisfied. Therefore, the state of A<B<C is most preferable.

(Fifth Embodiment)

Figure 15:
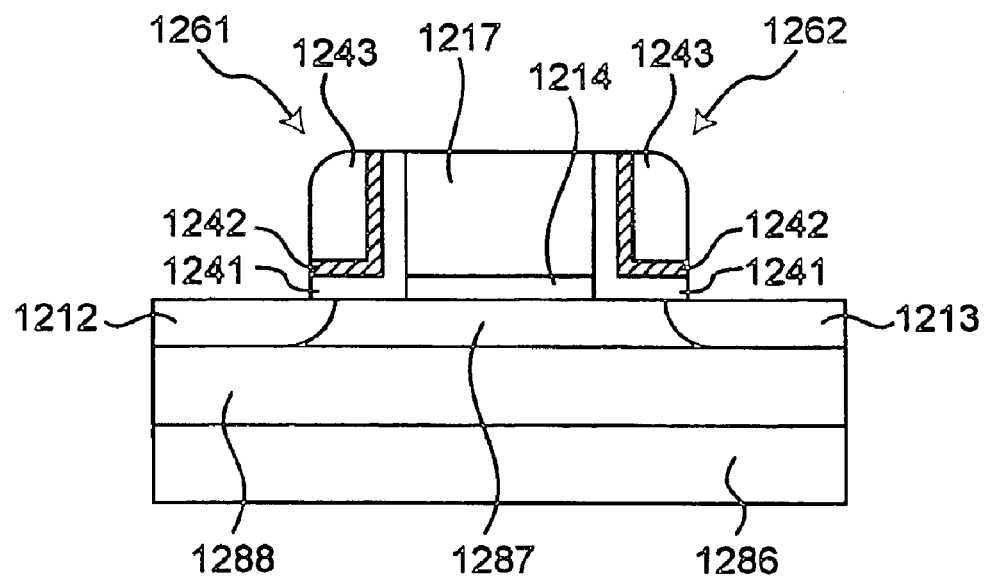
FIG. 15 is a schematic sectional view of an essential part of a memory element in a semiconductor storage device of a fifth embodiment of the present invention.

A memory device of semiconductor storage device according to this embodiment has essentially the same structure as that in the second embodiment except that the semiconductor substrate is SOI substrate as shown in FIG. 15.

The memory device is structured such that an embedded oxide film 1288 is formed on a semiconductor substrate 1286, and on top of the embedded oxide film 1288, SOI layer is further formed. In the SOI layer, there are formed diffusion regions 1212, 1213, and other areas constitute a body region 1287.

This memory device also brings about the functions and effects similar to those of the memory device in the second embodiment. Further, since the junction capacitance between the diffusion regions 1212, 1213 and the body region 1287 may be considerably reduced, it becomes possible to increase a device speed and to decrease power consumption.

(Sixth Embodiment)

Figure 16:
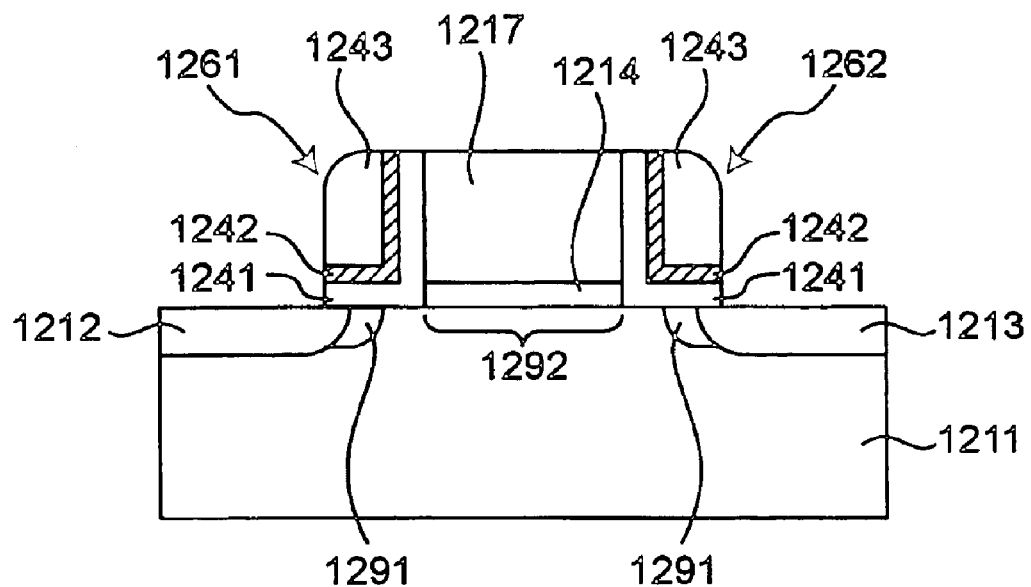
FIG. 16 is a schematic sectional view of an essential part of a memory element in a semiconductor storage device of a sixth embodiment of the present invention.

A memory device in this embodiment has essentially the same structure as that in the second embodiment except that in the vicinity of the channel side of N type diffusion regions 1212, 1213, a P type highly-concentrated region 1291 is added as shown in FIG. 16.

More specifically, the concentration of P type impurity (e.g., boron) in the P type highly-concentrated region 1291 is higher than the concentration of P type impurity in the region 1292. An appropriate value of the P type impurity concentration in the P type highly-concentrated region 1291 is, for example, around $5 \times 10^{17}$ to $1 \times 10^{19}$ cm$^{-3}$. Also, a value of the P type impurity concentration in the region 1292 may be set to, for example, $5 \times 10^{16}$ to $1 \times 10^{18}$ cm$^{-3}$.

Thus, providing the P type highly-concentrated region 1291 makes the junction between the diffusion regions 1212, 1213 and the semiconductor substrate 1211 steep right under the memory function bodies 1261, 1262. This facilitates generation of hot carriers in write and erase operation, thereby enabling reduction of voltage in write operation and erase operation or implementing high-speed write operation and erase operation. Further, since the impurity concentration in the region 1292 is relatively small, a threshold value when the memory is in erased state is small and so the drain current becomes large. Consequently, a read speed is increased. This makes it possible to provide a memory device having low rewrite voltage or a high rewrite speed, and having a high read speed.

Also in FIG. 16, by providing the P type highly-concentrated region 1291 in a position adjacent to the source/drain region and on the lower side of the memory function bodies 1261, 1262 (that is a position not right under the gate electrode), a threshold value of the entire transistor shows considerable increase. The degree of this increase is extremely larger than that in the case where the P type highly-concentrated region 1291 is right under the gate electrode. When write electric charges (electrons in the case where the transistor is N channel type) are stored in the memory function bodies 1261, 1262, the difference becomes larger. When enough erase electric charges (positive holes in the case where the transistor is N channel type) are stored in the memory function body, a threshold value of the entire transistor is decreased down to a value determined by the impurity concentration in the channel region (region 1292) under the gate electrode 1217. More specifically, the threshold value in the erased state is not dependent on the impurity concentration in the P type highly-concentrated region 1291, whereas the threshold value in the written state receives extremely large influence. Therefore, disposing the P type highly-concentrated region 1291 under the memory function bodies and adjacent to the source/drain region imparts extremely large fluctuation only to the threshold value in the written state, thereby enabling remarkable increase of memory effect (difference of threshold values in the erased state and the written state).

(Seventh Embodiment)

Figure 17:
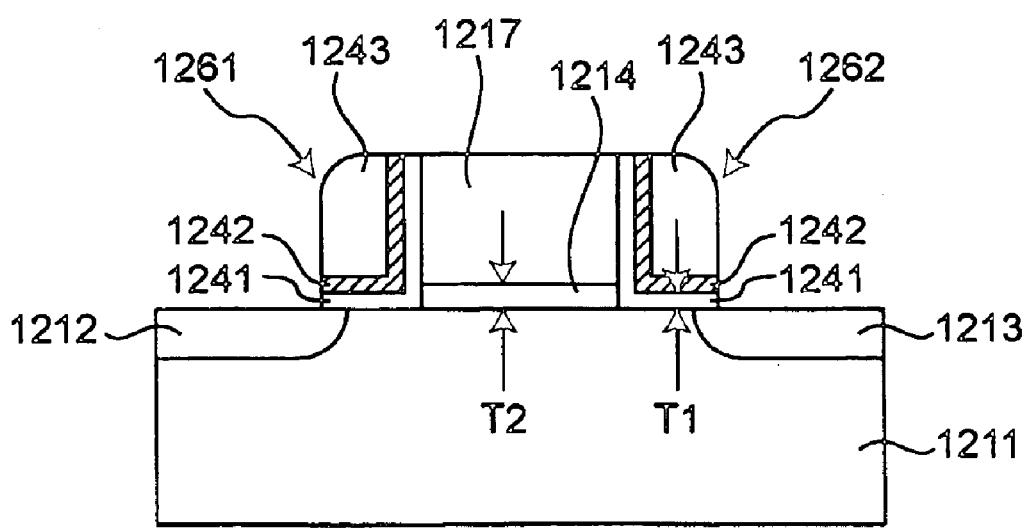
FIG. 17 is a schematic sectional view of an essential part of a memory element in a semiconductor storage device of a seventh embodiment of the present invention.

A memory body of a semiconductor storage device in this embodiment has essentially the same structure as that in the second embodiment except that the thickness T1 of the insulating film 1241 that separates the charge holding film (silicon nitride film 1242) from the channel region or the well region 1211 is smaller than the thickness T2 of the gate insulating film 1214 as shown in FIG. 17.

The gate insulating film 1214 has a lower limit of the thickness T2 because of the request for withstand voltage in memory rewrite operation. However, the thickness T1 of the insulating film 1241 can be smaller than T2 regardless of the request for withstand voltage.

In the memory device of the present embodiment, the thickness T1 of the insulating film has high design freedom as stated above because of the following reason.

In the memory device, the insulating film 1241 that separates the charge holding film (silicon nitride 1242) from the channel region or the well region is not interposed in between the gate electrode 1217 and the channel region or the well region. Consequently, the insulating film 1241 that separates the charge holding film (silicon nitride 1242) from the channel region or the well region does not receive direct influence from the high-electric fields that affect in between the gate electrode 1217 and the channel region or the well region, but receives influence from relatively weak electric fields expanding from the gate electrode 1217 in lateral direction. As a result, despite the request for withstand voltage to the gate insulating film 1214, it becomes possible to make T1 smaller than T2. Decreasing the thickness T1 of the insulating film facilitates injection of electric charges into the memory function bodies 1261, 1262, decreases voltage for write operation and erase operation, or enables high-speed write operation and erase operation. In addition, since an electric charge amount induced in the channel region or the well region increases when electric charges are stored in the silicon nitride film 1242, increased memory effect may be implemented.

Some electric lines of force having short length in the memory function body do not pass the silicon nitride film 1242 as shown with an arrow 1284 in FIG. 13. Since electric field strength is relatively large on such a short electric line of force, the electric fields along the electric line of force plays an important role in rewrite operation. By decreasing the thickness T1 of the insulating film 1241, the silicon nitride film 1242 moves to the lower side of the FIG. 13, so that the electric line of force shown with the arrow 1284 passes the silicon nitride film 1242. As a consequence, an effective dielectric constant in the memory function body along the electric line of force 1284 in the direction of arrow 1284 becomes large, which makes it possible to make potential difference between the both ends of the electric line of force 1284 smaller. Therefore, most part of voltage applied to the gate electrode 1217 is used to strengthen the electric fields in the offset region, thereby implementing high-speed write operation and erase operation.

Contrary to this, for example in EEPROM as typified by flash memory, an insulating film that separates a floating gate from the channel region or the well region is interposed in between a gate electrode (control gate) and the channel region or the well region, so that the insulating film receives direct influence from high electric fields of the gate electrode. In EEPROM, therefore, the thickness of the insulating film that separates the floating gate from the channel region or the well region is limited, which hinders optimization of the functions of a memory device.

As is clear from the above, by setting the thickness T1 of the insulating film 1241 and the thickness T2 of the gate insulating film 1214 as T1<T2, it becomes possible to decrease voltage in write operation and erase operation or implement high-speed write operation and erase operation, and to enable further increase of memory effect without degrading withstand voltage capability of the memory. It is noted that the thickness T1 of the insulating film is preferably 0.8 nm or more, that is the limit range in which uniformity in manufacturing process or certain level of film quality may be maintained and holding characteristics do not suffer extreme deterioration. More specifically, in the case of liquid crystal driver LSI which has a severe design rule and requires high withstand voltage, maximum 15 to 18V voltage is necessary for driving liquid crystal panel TFT (Thin Film Transistor). Eventually, it is not possible to make the gate oxide film thinner. In the case of mounting a nonvolatile memory of the present invention as an image adjuster together with other devices on the liquid crystal driver LSI, the memory device of the present invention enables optimum design of the thickness of the insulating film that separates the charge holding film (silicon nitride film 1242) from the channel region or the well region independently of the thickness of the gate insulating film. For example, in a memory cell with a gate electrode length (word line width) of 250 nm, there may be separately set like T1=20 nm and T2=10 nm, fulfilling a memory cell with good write efficiency. (Short channel effect is not generated even though T1 is larger than that of normal logic transistors, because the source/drain region is offset from the gate electrode.)

(Eighth Embodiment)

Figure 18:
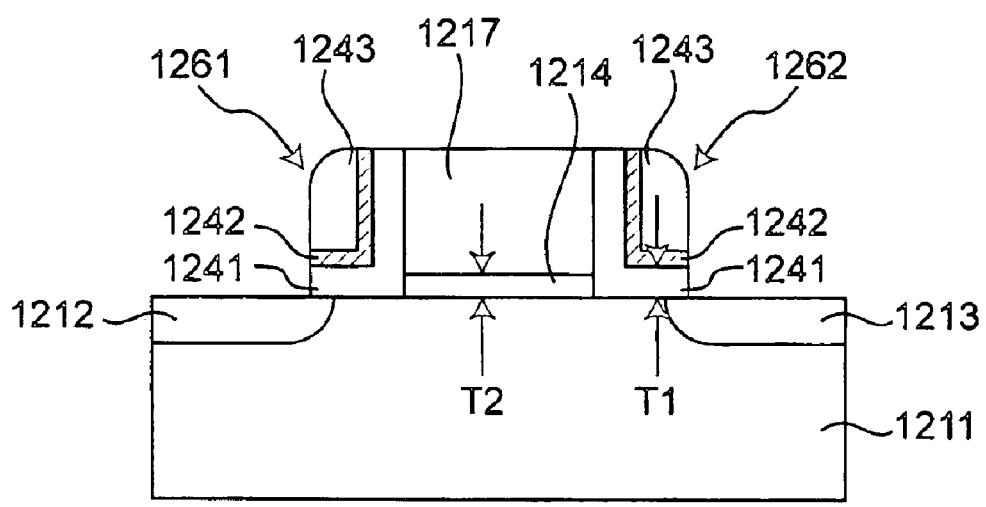
FIG. 18 is a schematic sectional view of an essential part of a memory element in a semiconductor storage device of an eighth embodiment of the present invention.

A memory device of a semiconductor storage device according to this embodiment has essentially the same structure as that in the second embodiment except that the thickness (T1) of the insulating film that separates the charge holding film (silicon nitride film 1242) from the channel region or the well region is larger than the thickness (T2) of the gate insulating film as shown in FIG. 18.

The gate insulating film 1214 has an upper limit of the thickness T2 because of the request for prevention of short channel effect of the device. However, the thickness T1 of the insulating film 1241 can be larger than T2 regardless of the request for prevention of short channel effect. More specifically, as miniaturization scaling proceeds (thinning of the gate insulating film proceeds), the thickness of the insulating film that separates the charge holding film (silicon nitride film 1242) from the channel region or the well region may be optimally designed independently of the thickness T2 of the gate insulating film, which implements the effect that the memory function body will not disturb scaling.

In the memory device of the present embodiment, the thickness T1 of the insulating film has high design freedom as stated above because, as is already described, the insulating film that separates the charge holding film from the channel region or the well region is not interposed in between the gate electrode and the channel region or the well region. As a result, despite the request for prevention of short channel effect to the gate insulating film, it becomes possible to make T1 larger than T2.

Increasing the thickness of the insulating film makes it possible to prevent dispersion of the electric charges stored in the memory function body and to improve holing characteristics of the memory.

Therefore, setting as T1>T2 enables improvement of holding characteristics without deteriorating short channel effect of the memory.

It is noted that the thickness T1 of the insulating film is preferably 20 nm or less in consideration of reduction of a rewrite speed.

More specifically, a conventional nonvolatile memory as typified by flash memory is structured such that a selection gate electrode constitutes a write/erase gate electrode, and a gate insulating film (including a floating gate) corresponding to the write/erase gate electrode serves also as an electric charge storage film. Consequently, since the request for miniaturization (creation of thinner devices is essential for restraining short channel effect) conflicts the request for securing reliability (in order to control leakage of stored electric charges, the thickness of an insulating film that separates a floating gate from the channel region or the well region cannot be decreased to smaller than approx. 7 nm), miniaturization of the device is difficult. In fact, according to ITRS (International Technology Roadmap for Semiconductors), miniaturization of a physical gate length down to approx. 0.2 micron or lower is not yet in sight. In the memory device of the present invention, independent designing of T1 and T2 is available as described above, and therefore miniaturization becomes possible.

In the present invention, for example, in a memory cell with a gate electrode length (word line width) of 450 nm, there is separately set like T2=4 nm and T1=7 nm, fulfilling a semiconductor storage device free from generation of short channel effect. Short channel effect is not generated even though T2 is set larger than that of normal logic transistors, because the source/drain region is offset from the gate electrode.

Also, since the source/drain region is offset from the gate electrode in the memory device of the present invention, miniaturization is further facilitated compared to normal logic transistors.

As described above, since an electrode for supporting write and erase operation is not present above the memory function body, the insulating film that separates the charge holding film from the channel region or the well region does not directly receive the influence of high electric fields that affect in between the electrode that supports write and erase operation and the channel region or the well region, but receives influence only from relatively weak electric fields expanding from the gate electrode in lateral direction. This makes it possible to fulfill a memory cell having the gate length miniaturized more than the gate length of the logic transistors in comparison with the same processing accuracy.

(Ninth Embodiment)

This embodiment relates to changes of electric characteristics when rewrite operation is performed in the memory device of the semiconductor storage device according to the present invention.

Figure 19:
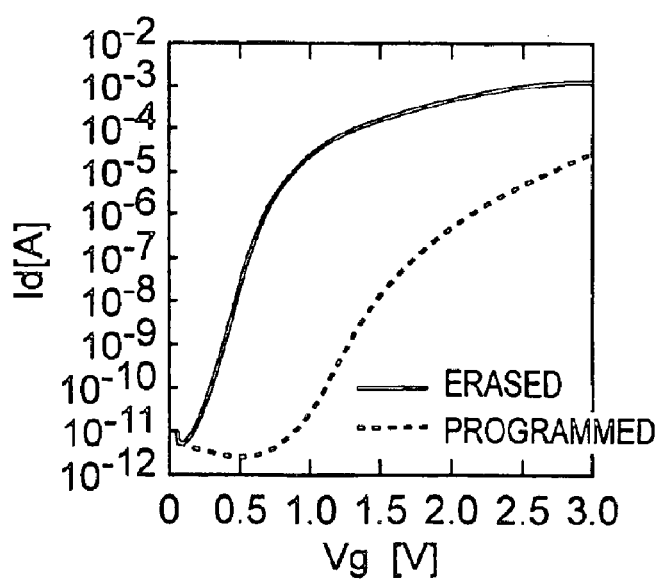
FIG. 19 is a graph showing the electrical characteristic of a memory element in a semiconductor storage device of a ninth embodiment of the present invention.

An N-channel type memory device displays a drain current (Id) versus a gate voltage (Vg) (measured values) as shown in FIG. 19 when an electric charge amount in the memory function body of varies between erase state and written (i.e., programmed) state.

Figure 27:
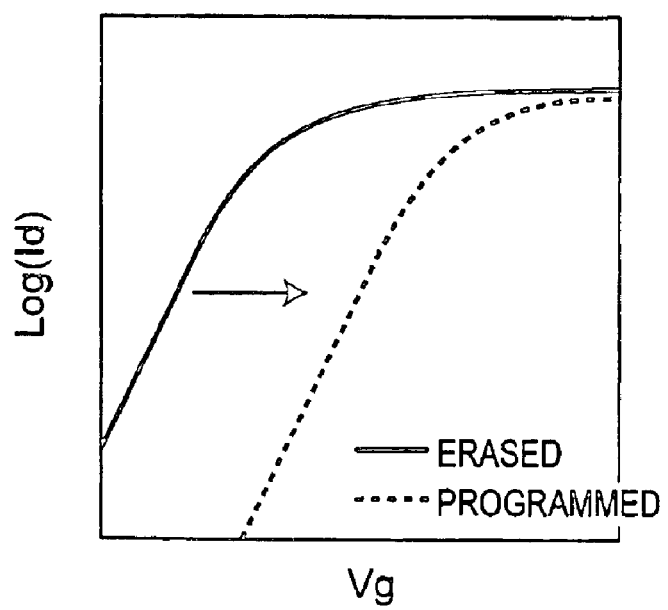
FIG. 27 is a graph showing the electrical characteristic of the conventional flash memory.

As clearly shown in FIG. 19, when write operation is performed in the erased state (a solid line), as shown by a broken line, not only the threshold value simply rises, but inclination of the graph dramatically falls especially in sub-threshold region. Therefore, even in the region with relatively high gate voltage (Vg), a drain current ratio of the erased state to the written state is large. For example in the point of Vg=2.5V, the current ratio is still two digits or more. This characteristic is largely different from that in the case of a flash memory as shown in FIG. 27.

The appearance of the above characteristic in the memory device is a phenomenon peculiar to the case where the gate electrode and the diffusion region are offset and therefore the gate electric fields are difficult to reach the offset region. When the memory device is in the programmed, or written state, an inversion layer is extremely difficult to be generated in the offset region below the memory function body even if a positive voltage is applied to the gate electrode. This causes smaller inclination of the Id-Vg curve line in the sub-threshold region in the written state.

When the memory device is in the erased state, high-density electrons are induced in the offset region. Further, when OV is applied to the gate electrode (i.e., in OFF state), electrons are not induced in the channel below the gate electrode (and therefore an off current is small). This causes large differential coefficient of the Id-Vg curve line in the sub-threshold region in the erased state and a large increase rate of current (conductance) even in the voltage region over the threshold.

As is clear from the above description, the memory device of the semiconductor storage device according to the present invention makes it possible to make the drain current ratio of the erased state to the written state particularly large.

(Tenth Embodiment)

In a tenth embodiment, a semiconductor storage device having a memory cell array in which the memory elements of any one of the first through eighth embodiments are employed as memory cells will be described.

Figure 20:
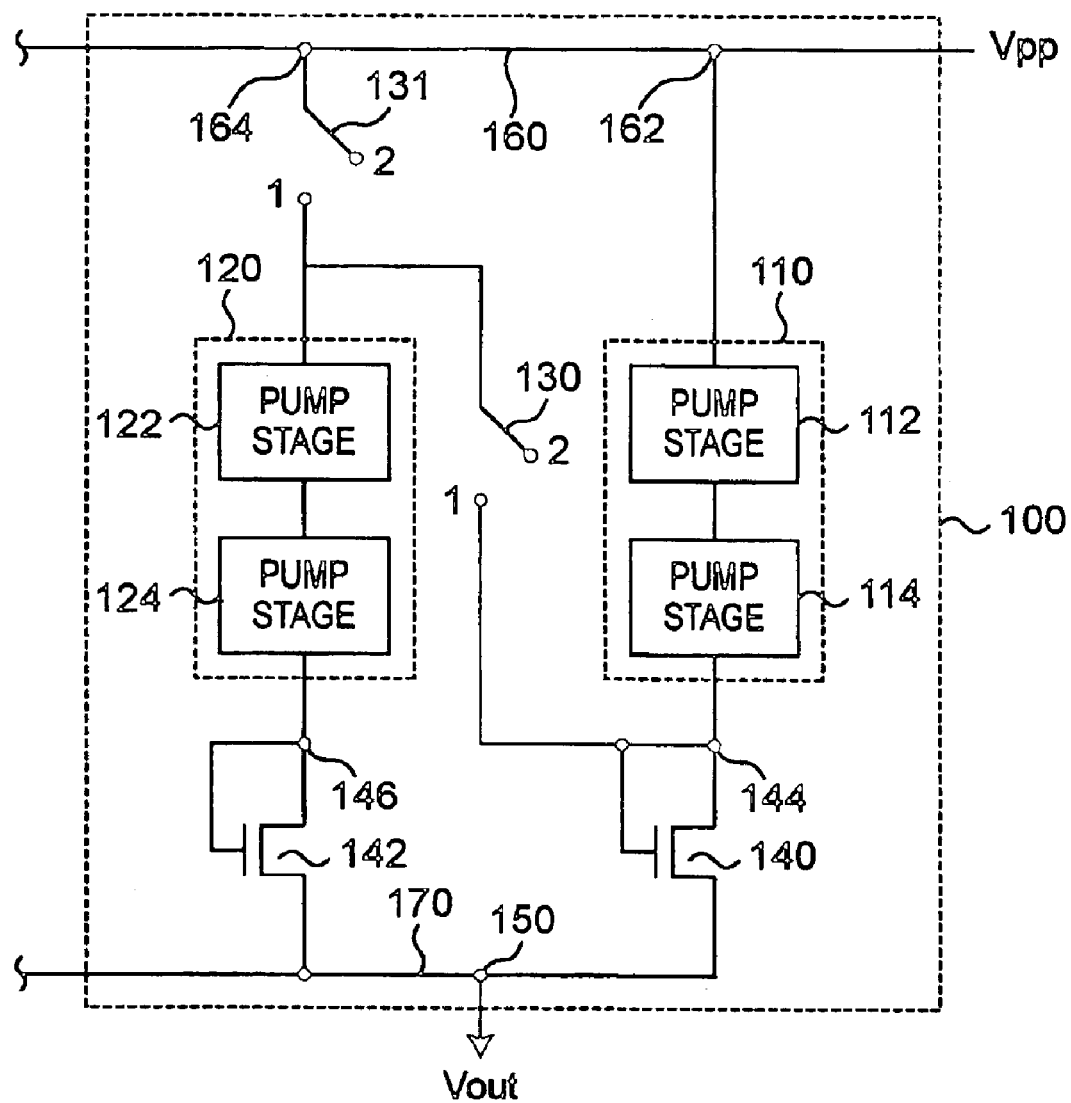
FIG. 20 is a block diagram of a variable-stage charge pump in a semiconductor storage device of a tenth embodiment of the present invention.

FIG. 20 shows a block diagram of a variable-stage charge pump 100 which is an example of a charge pump device included in the semiconductor storage device.

This variable-stage charge pump 100 includes a stage having a node 162 and a stage having a node 164. These stages are provided between a common input bus 160, which is as an example of the input line, and a common output bus 170, which is an example of the output line. This common output bus 170 includes a common output node 150. Also, the stage having the node 162 includes a first charge pump 110, and the stage having the node 164 includes a second charge pump 120. It is noted that a power supply voltage Vpp is applied to the common input bus 160. Also, an output from the common output bus 170 is fed to the memory cell array.

The first charge pump 110 has a pump stage 112, and a pump stage 114 connected in series to the pump stage 112. An input terminal of the first charge pump 110 (an input terminal of the pump stage 112) is connected to the common input bus 160 via the node 162. Also, an output terminal of the first charge pump 110 (an output terminal of the pump stage 114) is connected to a first switch 130, which is an example of the series-connection switch, via the node 144, and moreover connected to an n-channel MOSFET (Metal Oxide Semiconductor Field-Effect Transistor) 140, which is an example of the first output-side switch, via a node 144. Further, the MOSFET 140 is connected also to the common output node 150.

The second charge pump 120 includes a stage 122, and a stage 124 connected in series to the stage 122. An input terminal of the second charge pump 120 (an input terminal of the pump stage 122) is connected to the first switch 130, and moreover connected to a second switch 131, which is an example of the input-side switch. Further, an input terminal of the second switch 131 is connected also to the common input bus 160 via the node 164. Also, an output terminal of the second charge pump 120 (an output terminal of the stage 124) is connected to an n-channel MOSFET 142, which is an example of the second output-side switch, via a node 146. Further, the MOSFET 142 is connected also to the common output node 150.

The first switch 130 controls whether to give an output of the first charge pump 110 to the second charge pump 120. Also, the second switch 131 is used to apply the power supply voltage Vpp to the input terminal of the second charge pump 120. Then, the first switch 130 and the second switch 131 control whether the first charge pump 110 and the second charge pump 120 are connected to each other in series or in parallel.

The variable-stage charge pump 100 is also called a 'X/Y stage pump.' In this terminology, 'X' refers to the number of stages between the common input bus 160 and the common output node 150 (i.e., a maximum value of charge pumps). 'Y' refers to the number of stages of a charge pump. Accordingly, 'X multiplied by Y' represents a maximum value of stages that can be connected in series to one another between the common input bus 160 and the common output node 150. When such designations are applied to the variable-stage charge pump 100, the variable-stage charge pump 100, which has two stages, each stage having a charge pump equipped with two stages, can be called a '2/2 stage pump.' In the 2/2 stage charge pump, the four stages can be connected all in series, or two series-connected stages can be connected in parallel to the other two series-connected stages.

There are four possible combinations of the states of the first switch 130 and the states of the second switch 131 (two states by two switches). Changing the state of the first switch 130 and the state of the second switch 131 causes the connection between the first charge pump 110 and the second charge pump 120 to be changed, causing in turn the number of stages. An expression that the first switch 130 or the second switch 131 is ON means that the first switch 130 or the second switch 131 forms a current path. Also, an expression that the first switch 130 or the second switch 131 is OFF means that the switch is in an opened state. In other words, the switch circuit does not allow a large current to pass therethrough.

Figures 22, 23:
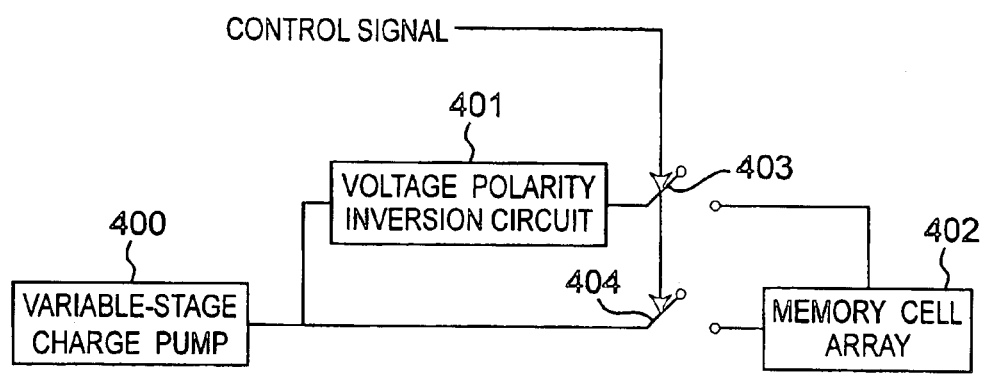
FIG. 22 shows a table for explaining the operations of first and second charge pumps in the semiconductor storage device of the tenth embodiment.
FIG. 23 shows a block diagram of a semiconductor storage device according to a thirteenth embodiment of the present invention.

FIG. 22 shows the four combinations.

As can be seen from of FIG. 22, in a first combination where both the first switch 130 and the second switch 131 are OFF, the first charge pump 110 becomes the only charge pump that supplies a voltage to the common output node 150. In this case, since the first charge pump 110 is a charge pump of two stages, the variable-stage charge pump 100 functions substantially as a 2-stage charge pump. This first combination can be used as a power saving mode for a case where a voltage is fed to the common output node 150 by both the first and the second charge pumps 110, 120.

In a second combination in which the first switch 130 is OFF and the second switch 131 is ON, the first charge pump 110 and the second charge pump 120 are connected to the common output node 150 in parallel to each other. In this case, since both the first charge pump 110 and the second charge pump 120 are 2-stage charge pumps, the variable-stage charge pump 100 functions virtually as a 4-stage charge pump in which two stages and two stages are connected in parallel to each other. In this second constitution, the variable-stage charge pump 100 is enabled to obtain at the common output node 150 an output voltage generally equal to that of the case where the first and second switches 130, 131 are both OFF. Also, since the first charge pump 110 and the second charge pump 120 are connected in parallel, the variable-stage charge pump 100 is enabled to feed nearly a double of the current quantity of the case where the variable-stage charge pump 100 is operated with the first charge pump 110 alone.

In a third combination in which the first switch 130 is ON and the second switch 131 is OFF, the first charge pump 110 and the second charge pump 120 are connected in series with each other. That is, the input voltage of the second charge pump 120 is given from the output of the first charge pump 110. Since both the first charge pump 110 and the second charge pump 120 are 2-stage charge pumps, the variable-stage charge pump 100 functions virtually as a 4-stage charge pump in which four stages are connected in series. In this constitution, the variable-stage charge pump 100 is enabled to obtain at the common output node 150 a double of the output voltage obtained by the first or second constitution. However, the variable-stage charge pump 100 in this case can provide only generally half the current of the second constitution.

In FIG. 22, 'N/A' is shown as a fourth state.

The fourth state should not be used, and the 'N/A' indicates that the state is inapplicable. In the case where both the first switch 130 and the second switch 131 are ON, the first charge pump 110 is short-circuited, with its output connected to its input and the supply voltage. Such operation is harmful to the variable-stage charge pump 100 of this embodiment and therefore should be avoided.

The n-channel MOSFET 140 and the n-channel MOSFET 142 shown in FIG. 22 are connected in a diode fashion between the output terminals of the first and second charge pumps 110 and 120 and the common output node 150. This arrangement prevents the first charge pump 110 and the second charge pump 120 from being short-circuited while the first charge pump 110 and the second charge pump 120 are connected in series with each other.

Without the diode connection of the MOSFET 140, i.e., without the placement of the MOSFET 140, when the first switch 130 is ON and the second switch 131 is OFF, the second charge pump 120 would be short-circuited. In this case, the node 144 would be connected to the common output node 150 and the input terminal of the second charge pump 120. Then, the output terminal of the second charge pump 120 would be connected to the common output node 150, so that the output of the charge pump 120 would be connected to the input of the second charge pump 120. Such a connection invalidates the second charge pump 120 and so, generally, is not used.

With the placement of the MOSFET 140, when the voltage of the common output node 150 is higher than the voltage of the node 144, the current is not allowed to pass through the MOSFET 140. That is, the MOSFET 140 results in a non-conducting state. This is a status when the first charge pump 110 and the second charge pump 120 are connected in series to each other. Also, when the first charge pump 110 and the second charge pump 120 are connected in series to each other, the voltage of the node 146 becomes higher than the voltage of the node 144. Then, if the voltage of the node 146 exceeds the voltage of the common output node 150 by the threshold voltage of the MOSFET 142, then the MOSFET 142 goes conducting to supply a voltage obtained at the node 146 (the voltage value resulting from subtraction of the threshold voltage of the MOSFET 142) to the common output node 150. The MOSFET 140 will not go conducting unless the voltage resulting from subtracting the threshold voltage of the MOSFET 140 from the voltage of the node 144 exceeds the voltage of the common output node 150.

As can be seen from the above description, the MOSFETs 140, 142 can stabilize the series-connection of the first and second charge pumps 110, 120.

A lower threshold voltage of the MOSFETs 140, 142 would contribute to reduction of voltage drops by the MOSFET 140 and the MOSFET 142. In this case, larger portions of the voltages supplied by the pump stages 112, 114, 122, 124 arrive at the common output node 150. Typical low threshold voltages for the MOSFETs 140, 142 are preferably less than 1 V in general, and more preferably within a range of 0.2 V to 0.9 V, inclusive.

In another embodiment of the present invention, the variable-stage charge pump 100 is a negative charge pump which supplies less than 0 volts from the power supply voltage Vpp. In this case, the pump stages 112, 114, 122, 124 are negative charge pump stages. In this embodiment, for the variable-stage charge pump 100 to function correctly as a negative charge pump, p-channel MOSFETs need to be used instead of the n-channel MOSFETs 140, 142.

The series-connection switches and the input-side switches of the present invention are not limited to those of the above embodiments.

For example, a MOSFET may be used as an example of the series-connection switch. Also, a MOSFET may be used as the input-side switch. That is, MOSFETs may be used instead of the first switch 130 and the second switch 131. In this case, in order to maximize the range of the voltage that passes through the MOSFETs used instead of the first, second switches 130, 131, an output voltage Vout from the common output node 150 can be used as a control voltage for the gate of the relevant MOSFET.

Further, the first and second output-side switches are also not limited to those of the above embodiment.

For example, in the above embodiment, the first charge pump 110 and the common output bus 170 are connected to each other by the n-channel MOSFET 140. However, the first charge pump 110 and the common output bus 170 may be connected to each other by, for example, an open/close type switch.

Also in the above embodiment, the second charge pump 120 and the common output bus 170 are connected to each other by the n-channel MOSFET 142. However, the second charge pump 120 and the common output bus 170 may be connected to each other by, for example, an open/close type switch.

Further, in the above embodiment, the diode-connected n-channel MOSFETs 140, 142 are used. Instead, non-diode-connected n-channel MOSFETs 140 may also be used.

In the present invention, the number of stages of the charge pump device and the number of pump stages are not limited to those of the above embodiment. That is, the number of stages of the charge pump device and/or the number of pump stages may be three or more.

(Eleventh Embodiment)

In a semiconductor storage device of an eleventh embodiment of the present invention, the variable-stage charge pump 100 has n charge pumps each having y stages. These variables 'n' and 'y' are assumed to be positive integers. This variable-stage charge pump 100 is a 'n/y-stage pump' according to the foregoing nomenclature or fashion of designation. Properly selecting subsets of the first and second switches 130 and 131 allows n charge pumps to be divided into m sets of p charge pumps. In this case, each set of p charge pumps is equivalent to a 'p/y variable-stage charge pump.' Since the charge pump sets can be connected either in series or in parallel, various combinations are implementable. Further, the stages within each set may be connected either in series or in parallel. For example, assume that the variable-stage charge pump 100 has twelve stages. Then, each stage in the variable-stage charge pump 100 includes one charge pump. Each charge pump includes two stages connected in series to each other. Therefore, the variable-stage charge pump 100 is a 12/2-stage pump according to the foregoing nomenclature. Also, in the variable-stage charge pump 100, the twelve charge pumps each having two stages can be connected in parallel to one another, or the totally twenty-four stages can be connected in series with one another.

In this connection, the 12 stages can be regrouped into 4 sets of 3 stages. Accordingly, each set constitutes a 3/2-stage pump. This means that two ways of combinations are available in each set as defined. That is, all the six stages are connected in series, or 3 sets of 2 stages are connected in parallel. Further, the individual sets may be connected to one another either in parallel or in series. Various combinations can be designated more simply by using a symbolic nomenclature. Symbol 'S' and symbol 'P' represent that the stages within each set are connected in series or in parallel. The 'S' indicates that the stages within each set are connected in series, and the 'P' indicates that the stages within each set are connected in parallel. Also, symbol '‖' indicates that sets are connected in parallel, and symbol '-' indicates that sets are connected in series. With the use of the symbols 'S', 'P', '‖' and '-', seven possible combinations of connections of the 4 sets of 3 stages would be: S‖S‖S‖S, P‖P‖P‖P, S-S-S-S, P-P-P-P, S-P-P-P, S-S-P-P, and S-S-S-P. Of these combinations, two (i.e., S-S-S-S and P‖P‖P‖P) can be achieved without using the step of regrouping the stages into sets, and is therefore redundant. However, these examples show that power supply arrangements of at least the other five examples can be achieved by individually controlling the subsets of stages.

In addition to these various arrangements, the subsets of all the stages can be selected for the formation of the power supply. In other words, by selectively canceling stages (i.e., switching to an OFF side) with second switches properly associated therewith, it becomes possible to use part of stages for various charge pumps. This can be used for power supply saving without using all the stages nor using voltage dividers or shunts in circuits to which power supply or other voltages are fed (e.g., a memory circuit). Voltage dividers and shunts, having a tendency toward power consumption, should be eliminated for power saving.

The definition of the 'X/Y' designation rules is slightly changed here. So far, the symbol 'X' has been used to represent the total number of stages, and each stage has been treated as a charge pump. In contrast to this, here, 'X/Y' represents that X sets of stages, which are equivalent to X charge pumps, are connected in parallel and that the parallel-connected X sets of stages, or charge pumps each have Y series-connected stages. Because the original stages are regrouped here into a plurality of sets of stages, it would be apparent that each set of stages constitute a charge pump.

By designing a variable-stage charge pump with a proper number of stages, the variable-stage charge pump is enabled to apply proper voltages to a memory circuit regardless of usable power voltages. For example, in the case where a plurality of levels of voltages need to be applied to memory circuits by using the variable-stage charge pump, the designer is enabled to design such that the switches are controlled to perform the switching between stage-in and stage-out or change the connections between the stages in order to securely obtain proper output voltages by the variable-stage charge pump regardless of an input voltage. The control of the switches could naturally be given by a function between a usable power supply voltage Vpp and a desired output voltage of the variable-stage charge pump. Since there would arise some loss upon control of the output of the variable-stage charge pump, the voltage fed by the variable-stage charge pump generally has to be higher than the voltage necessary for the power-fed circuit.

Moreover, external circuits are simplified when the variable-stage charge pump is incorporated into a semiconductor storage device in which the memory elements of the foregoing first to eighth embodiments are used as the memory cells of the memory cell array. However, for the use of the memory elements to the utmost extent, it is necessary that the variable-stage charge pump be capable of generating required voltage levels from the power supply voltage.

(Twelfth Embodiment)

Figure 21:
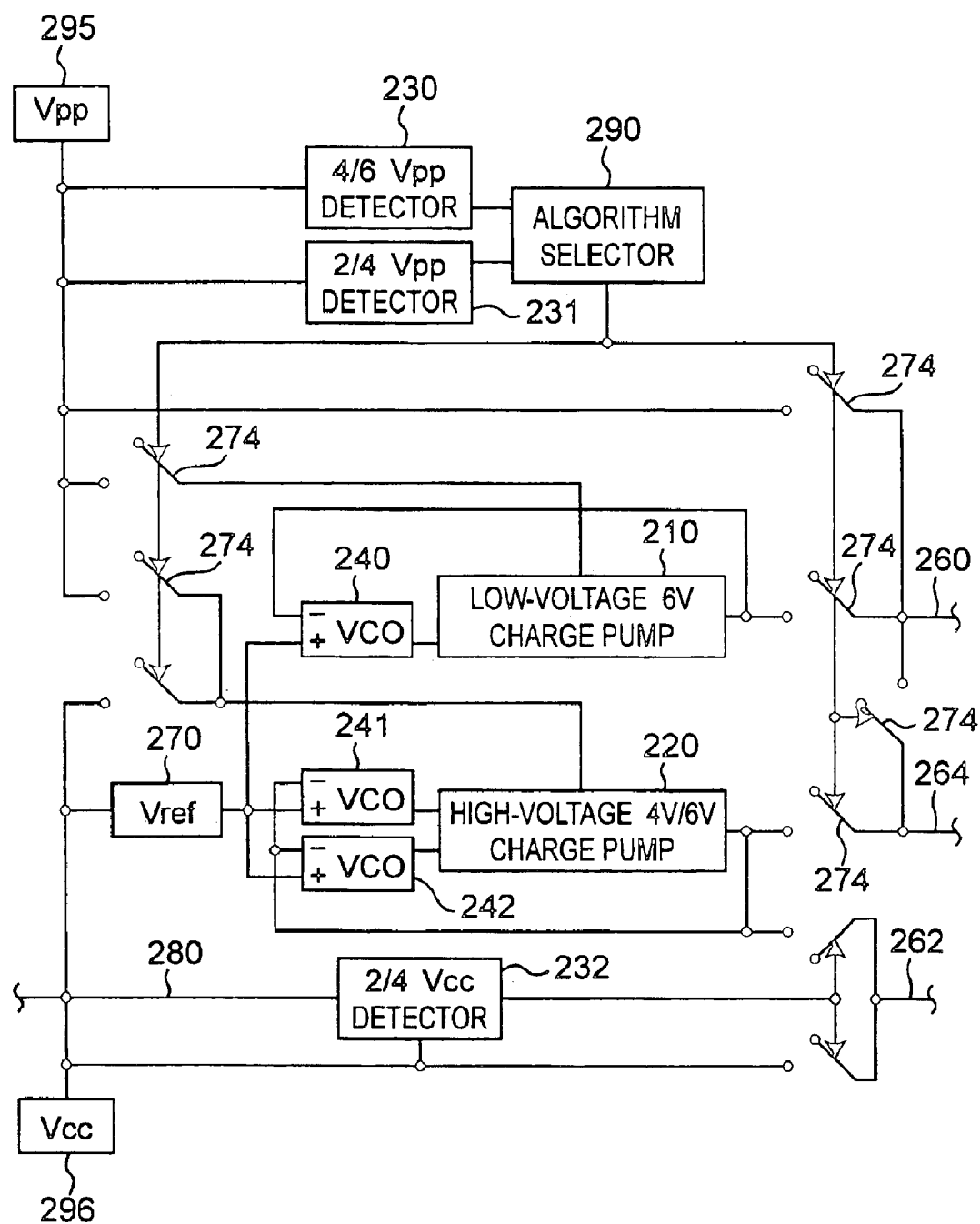
FIG. 21 is a block diagram of a power supply circuit including a variable-stage charge pump in a semiconductor storage device of a twelfth embodiment of the present invention.

FIG. 21 shows a block diagram of a power supply circuit including variable-stage charge pumps 210, 220 which are an example of the charge pump device of the semiconductor storage device according to a twelfth embodiment of the present invention. These variable-stage charge pumps 210, 220 are used to manage the voltage levels of 4 V and 6 V with the power supply of 2 V or 4 V.

It is noted that in FIG. 21, a legend "low-current 6V charge pump" is given within a block showing the variable-stage charge pump 210, while a legend "high-current 4V/6V charge pump" is given within a block showing the variable-stage charge pump 220.

The variable-stage charge pumps 210, 220, whose output is fed to a voltage regulator, are so designed as to generate voltages beyond nominally required voltages. It is noted that a proper power supply tolerance in general requires that the circuit properly functions on condition that the input voltage is within a specified percentage range (e.g., 10%) of the nominal value.

The variable-stage charge pump 220 is a high-current variable-stage charge pump. The variable-stage charge pump 210 is a low-current variable-stage charge pump which is used in addition to the charge pump 220 only when necessary. Also, the variable-stage charge pumps 210, 220 are used in order to increase voltages of internal nodes to different values in the read mode, the write (program) mode, and the erase mode. Charge pumps included in the variable-stage charge pumps are restructured by the power supply voltage Vpp of 2 V or 4 V and a voltage level to be outputted.

Stage control over the variable-stage charge pumps 210, 220 is determined depending on the operation mode(read, write, or erase) and the level of a power supply voltage Vpp. The level of the power supply voltage Vpp is detected by a 4/6 Vpp detector 230 and a 2/4 Vpp detector 231, and the level of a power supply voltage Vcc is detected by a 2/4 Vcc detector 232. More specifically, the 4/6 Vpp detector 230 is used to decide whether the power supply voltage Vpp is 4 V or 6 V. The 2/4 Vpp detector 231 is used to decide whether the power supply voltage Vpp is 2 V or 4 V. Further, the 2/4 Vcc detector 232 is used to decide whether the power supply voltage Vcc is 2 V or 4 V. Outputs of the 4/6 Vpp detector 230 and the 2/4 Vpp detector 231 are received by an algorithm selector 290 in order to select a proper algorithm for various levels of the power supply voltage Vpp. The algorithm depends on the power supply voltage Vpp and the power supply voltage Vcc. The algorithm selector 290 controls switches 274 according to the individual algorithms.

For example, when outputs of the power supply circuit are fed to the memory cell array, the switches 274 are used for the control of the power to the charge pump 210 and the charge pump 220 in order to select a proper power supply to be fed to the memory cell array. The power to the memory cell array is fed by a line 260, a line 262 and a line 264. The line 260 feeds the memory cell array with the power supply voltage Vpp derived from a Vpp pad 295 or a voltage of 6 V derived from the variable-stage charge pump 210 and the variable-stage charge pump 220. Depending on the individual operation modes of the memory cell array, a proper voltage is fed to the memory cell array. The line 262 feeds the memory cell array with a voltage of 4 V derived from the variable-stage charge pump 220 or the power supply voltage Vcc derived from a Vcc pad 296. It is noted that a line 280 is used to enable or disable the 2/4 Vcc detector 232.

In order to drive the variable-stage charge pumps 210, 220, a VCO (voltage-controlled oscillator) 240 and a VCO 241 are used. A reference voltage Vref to be applied to the VCO 240, the VCO 241 and a VCO 242 are generated by a reference voltage generation circuit 270. The reference voltage Vref and feedbacks from outputs of the variable-stage charge pumps 210, 220 are used as control voltages to help the VCOs 240–242 control the output voltages of the variable-stage charge pumps 210, 220. It is noted that the VCO 242 functions as a standby VCO while the memory cell array is in the standby mode.

The variable-stage charge pump 220, which is a high-current variable-stage charge pump, and the variable-stage charge pump 210, which is a low-current variable-stage charge pump, are restructured by the operation mode and the value of the detected power supply voltage Vpp.

In particular operation modes, the variable-stage charge pump 210 is not used and can be set OFF. Therefore, the variable-stage charge pump 220 receives power not from the Vpp pad 295 but from the Vcc pad 296, as required. When the 2/4 Vcc detector 232 has detected that the power supply voltage Vcc of that Vcc pad 296 is less than 3.0 V, the variable-stage charge pump 220 is needed to feed 4 V to the line 262. In the case where the 2/4 Vcc detector 232 has detected that the power supply voltage Vcc is not less than 3.0 V, the power supply voltage Vcc is assumed to be enough, and the line 262 is switched so that the voltage is fed not from the variable-stage charge pump 220 (which is no longer necessary and can be set OFF) but from the Vcc pad 296 directly to the memory cell array.

(Thirteenth Embodiment)

FIG. 23 shows a block diagram of a semiconductor storage device according to a thirteenth embodiment of the present invention.

This semiconductor storage device is provided with a voltage polarity inversion circuit 401. This voltage polarity inversion circuit 401 is a device for inverting the polarity of an input voltage and outputting the resulting voltage. An input terminal of the voltage polarity inversion circuit 401 is connected to an output terminal of a variable-stage charge pump 400, which is an example of the charge pump device, and an output terminal of the voltage polarity inversion circuit 401 is connected to an input terminal of a memory cell array 402 via a switch 403. Also, an output terminal of the variable-stage charge pump 400 is connected to an input terminal of the memory cell array 402 via a switch 404. The switches 403, 404 are controlled by a control signal outputted by an unshown control unit.

By using the voltage polarity inversion circuit 401 of the above-described constitution, a negative voltage can be fed to the memory cell array 402. Therefore, even if the memory cell array 402 employs the memory elements of the foregoing first to eighth embodiments as its memory cells, the variable-stage charge pump 400 can be made ready for the individual operation modes of the memory cell array 402.

Also, since an output of the variable-stage charge pump 400 is used as an input of the voltage polarity inversion circuit 401, a plurality of negative-voltage levels can simply be fed to the memory cell array 402.

Furthermore, in an operation mode of the memory cell array 402, within the variable-stage charge pump 400, there is a charge pump that is not used, depending on the input voltage level and output voltage level of the variable-stage charge pump 400. This unused charge pump is used to feed a negative voltage to the memory cell array 402 in this operation mode. This makes it possible to obtain negative voltage levels required in the individual operation modes of the memory cell array 402 without using any exclusive charge pump. Besides, since there is no need for providing any exclusive charge pump to generate the negative voltage levels, it becomes possible to reduce the circuit area.

The variable-stage charge pump 400 can be manufactured together with the memory cell array 402 within the same package. Alternatively, the variable-stage charge pump 400 may be placed outside the memory cell array package 402.

In this embodiment, one voltage polarity inversion circuit 401 is connected between the variable-stage charge pump 400 and the memory cell array 402. However, two or more voltage polarity inversion circuits may be connected between the variable-stage charge pump 400 and the memory cell array 402.

(Fourteenth Embodiment)

Figure 24:
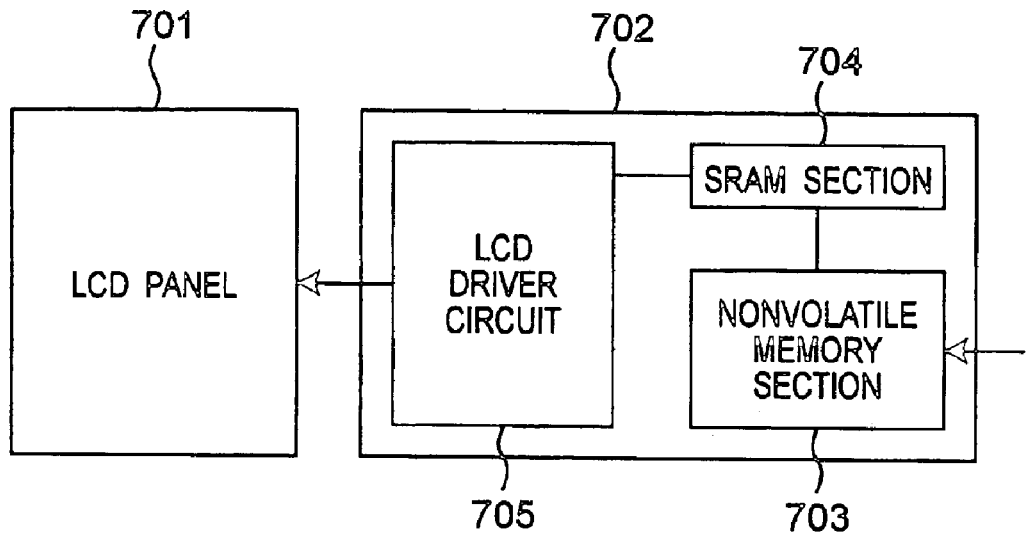
FIG. 24 is a diagram schematically showing the structure of a liquid crystal display device in which the semiconductor storage device of the present invention is incorporated.

The aforementioned semiconductor storage device is exemplified by a rewritable nonvolatile memory for the image adjustment of an LCD panel as shown in FIG. 24.

The LCD panel 701 shown in FIG. 24 is driven by an LCD driver 702. The LCD driver 702 has a nonvolatile memory section 703 as a semiconductor storage device, an SRAM (Static Random Access Memory) section 704 and an LCD driver circuit 705. The nonvolatile memory section 703 includes nonvolatile memory elements, which are preferably constructed according to any one of the tenth to thirteenth embodiments. The nonvolatile memory section 703 has an externally rewritable construction.

Information stored in the nonvolatile memory section 703 is transferred to the SRAM section 704 when the power supply of the equipment is turned on. The LCD driver circuit 705 can read the storage information from the SRAM section 704 at need. By providing the SRAM section, the storage information can be read at a very high speed.

The LCD driver 702 may either be externally attached to the LCD panel 701 as shown in FIG. 24 or formed on the LCD panel 701.

The LCD panel changes the display gradation or tone by applying multi-step voltages to the pixels, though the relation between the voltage applied and the display gradation varies among products. Therefore, if information for correcting such variations of individual products is stored after the completion of each product and correction is performed based on the stored information, the image qualities of the products can be uniformed. Therefore, it is preferable to mount a rewritable nonvolatile memory for storing the correction information on the LCD driver. Further, for such a rewritable nonvolatile memory, it is preferable to employ the nonvolatile memory elements of the present invention and particularly preferable to employ the semiconductor storage device described in connection with any one of the tenth to thirteenth embodiments in which the nonvolatile memory elements of the present invention are integrated.

If the memory elements of the present invention are employed for the nonvolatile memory for adjusting the image of the LCD panel, the manufacturing cost can be reduced because the process of consolidation with the other circuits such as the LCD driver is easy. Moreover, the semiconductor storage devices described in connection with the tenth to thirteenth embodiments have a comparatively small memory scale and are particularly suitable for the case where reliability and stability are valued. Normally, the nonvolatile memory for adjusting the image of the LCD panel has a capacity of several kilobytes, and this memory scale is comparatively small. Therefore, it is especially preferable to employ any one of the semiconductor storage devices described in connection with the tenth to thirteenth embodiments as the nonvolatile memory for adjusting the image of the LCD panel.

(Fifteenth Embodiment

Figure 25:
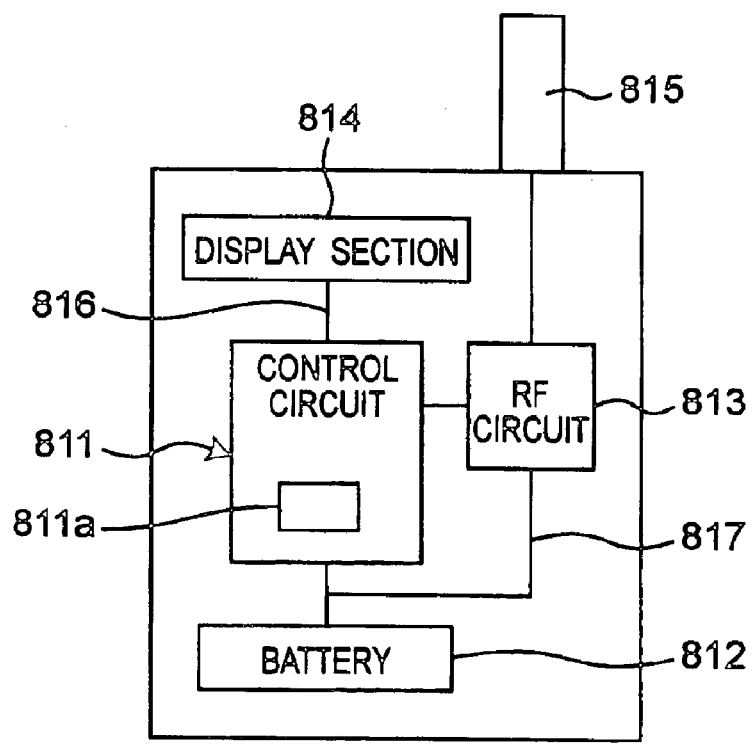
FIG. 25 is a diagram schematically showing the structure of portable electronic equipment in which the semiconductor storage device of the present invention is incorporated.
Figure 26:
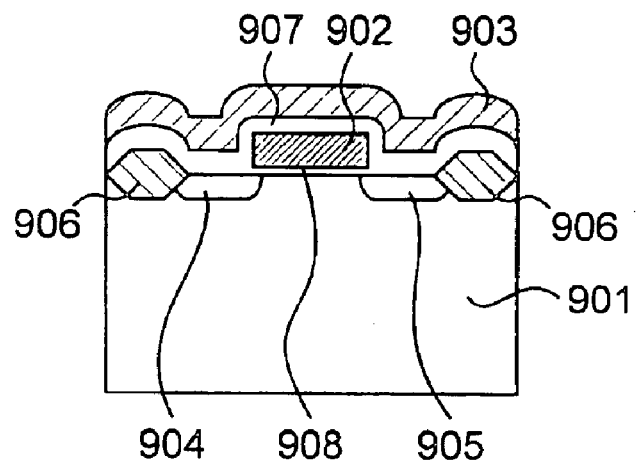
FIG. 26 is a schematic sectional view of an essential part of a conventional flash memory.

FIG. 25 shows a portable telephone which is an example of portable electronic equipment having the aforementioned semiconductor storage device incorporated therein.

This portable telephone is constituted essentially of a control circuit 811, a battery 812, an RF (Radio Frequency) circuit 813, a display section 814, an antenna 815, a signal line 816 and a power line 817. A semiconductor storage device 811a according to any one of the foregoing embodiments is incorporated in the control circuit 811. The control circuit 811 should preferably be an integrated circuit where devices of an identical structure are concurrently used as memory circuit elements and logic circuit elements. This facilitates the manufacturing of integrated circuits and allows the manufacturing cost of the portable electronic equipment to be especially reduced.

As described above, by employing the semiconductor storage device that facilitates the fabricating process for the memory section and the logic circuit section in combination and that allows a high speed read operation, it is possible to improve the operating speed of the portable electronic equipment and reduce the production costs. Thus, less expensive, high-performance, and high-function portable electronic equipment is achievable.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising:
   a charge pump device; and
   a memory cell array to which an output from an output line of the charge pump device is fed and which uses nonvolatile memory elements as memory cells,
   wherein the charge pump device has:
   k (where k is a positive integer equal to or more than 2) charge pumps which are connected between an input line and the output line;
   output-side switch means for electrically connecting or disconnecting respective output terminals of the k charge pumps to or from the output line;
   input-side switch means for electrically connecting or disconnecting input respective terminals of the charge pumps except one charge pump, respectively, to or from the input line; and
   series-connection switch means for electrically connecting or disconnecting the output terminal of an nth (where n is an integer of 1 to k−1) charge pump to or from the input terminal of an (n+1)th charge pump, and
   wherein the nonvolatile memory elements each have:
   a gate electrode formed on a semiconductor layer with a gate insulator disposed therebetween;
   a channel region placed under the gate electrode with the gate insulator disposed therebetween;
   diffusion regions placed on opposite sides of the channel region, respectively, and having a conductive type opposite to that of the channel region; and
   memory-function bodies formed on opposite sides of the gate electrode, respectively, and having a function of holding electric charges.

2. The semiconductor storage device as claimed in claim 1, wherein
   the output-side switch means includes output-side switches provided on lines, respectively, that connect the individual output terminals of the charge pumps to the output line;
   the input-side switch means includes input-side switches provided on lines, respectively, that connect the individual input terminals of the charge pumps except the one charge pump to the input line; and
   the series-connection switch means includes a series-connection switch provided on a line that connects the output terminal of the nth charge pump to the input terminal of the (n+1)th charge pump.

3. The semiconductor storage device as claimed in claim 1, wherein
   the k charge pumps include first and second charge pumps;
   the output-side switch means includes a first output-side switch provided on a line that connects the output terminal of the first charge pump to the output line, and a second output-side switch provided on a line that connects the output terminal of the second charge pump to the output line;

the input-side switch means includes an input-side switch provided on a line that connects the input terminal of the second charge pump to the input line; and the series-connection switch means includes a series-connection switch provided on a line that connects the output terminal of the first charge pump and the input terminal of the second charge pump.

4. The semiconductor storage device as claimed in claim 1, wherein the output-side switch means comprises diode-connected field-effect transistors.

5. The semiconductor storage device as claimed in claim 1, wherein at least one of the k charge pumps includes a plurality of pump stages connected in series.

6. The semiconductor storage device as claimed in claim 1, further comprising:

at least one voltage polarity inversion circuit provided on a line that connects an output terminal of the semiconductor storage device and an input terminal of the memory cell array.

7. The semiconductor storage device as claimed in claim 1, wherein at least part of the memory function bodies owned by the memory element overlaps with part of the diffusion regions.

8. The semiconductor storage device as claimed in claim 1, wherein the memory function bodies of each nonvolatile memory element each include:

a film having a surface roughly parallel to a surface of the gate insulation film and having a function of retaining electric charges; and an insulation film separating the film having the function of retaining electric charges from the channel region or the semiconductor layer, the insulation film having a film thickness thinner than a film thickness of the gate insulation film and not smaller than 0.8 nm.

9. Portable electronic equipment having the semiconductor storage device claimed in claim 1.

* * * * *